United States Patent
Yamauchi

(10) Patent No.: US 9,583,057 B2
(45) Date of Patent: Feb. 28, 2017

(54) PIXEL CIRCUIT AND DISPLAY DEVICE

(71) Applicant: Sharp Kabushiki Kaisha, Osaka-shi, Osaka (JP)

(72) Inventor: Yoshimitsu Yamauchi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 254 days.

(21) Appl. No.: 14/371,194

(22) PCT Filed: Dec. 14, 2012

(86) PCT No.: PCT/JP2012/082515
§ 371 (c)(1),
(2) Date: Jul. 9, 2014

(87) PCT Pub. No.: WO2013/105393
PCT Pub. Date: Jul. 18, 2013

(65) Prior Publication Data
US 2015/0009111 A1   Jan. 8, 2015

(30) Foreign Application Priority Data

Jan. 12, 2012   (JP) ................................ 2012-003711

(51) Int. Cl.
*G09G 5/00* (2006.01)
*G09G 3/36* (2006.01)
(Continued)

(52) U.S. Cl.
CPC .......... *G09G 3/3648* (2013.01); *G06F 1/3265* (2013.01); *G09G 3/2003* (2013.01);
(Continued)

(58) Field of Classification Search
CPC .......... G09G 2300/0842; G09G 3/3648; G09G 3/2003; G09G 3/3688; G09G 3/3233;
(Continued)

(56) References Cited

U.S. PATENT DOCUMENTS

| 2006/0007773 A1* | 1/2006 | King ..................... G11C 11/417 365/232 |
| 2010/0177083 A1* | 7/2010 | Yamashita ............... G09G 3/20 345/211 |
| 2012/0212521 A1 | 8/2012 | Yamauchi et al. | |

FOREIGN PATENT DOCUMENTS

WO   2011/052272 A1   5/2011

OTHER PUBLICATIONS

Official Communication issued in International Patent Application No. PCT/JP2012/082515, mailed on Feb. 5, 2013.

* cited by examiner

*Primary Examiner* — Jonathan Boyd
(74) *Attorney, Agent, or Firm* — Keating & Bennett, LLP

(57) ABSTRACT

Provided are a pixel circuit and a display device which support multi-gradation display and can prevent display quality from deteriorating with low power consumption. A pixel circuit (3) includes a first switch circuit (22) provided between a pixel node Np of a display element unit (21) and a data signal line SL, and a memory circuit (23) which restores the pixel node to an initial voltage state, based on a hold voltage stored in a storage node Nm. The memory circuit (23) includes a transistor T1 having a gate electrode connected to the storage node Nm, and a source electrode connected to the pixel node Np; a second switch circuit (24) which controls a conducting state between a drain electrode of the transistor T1 and a voltage supply line VSL, in response to a signal level of a first control signal line SWL; a third switch circuit (25) which controls a conducting state between the drain electrode and the gate electrode of the transistor T1, in response to a signal level of a second control signal line CSL; and a capacitor element Cst provided between the storage node Nm and the voltage supply line VSL.

18 Claims, 19 Drawing Sheets

(51) Int. Cl.
*G09G 3/32* (2016.01)
*G06F 1/32* (2006.01)
*G09G 3/20* (2006.01)
*H01L 27/12* (2006.01)

(52) U.S. Cl.
CPC ......... *G09G 3/3233* (2013.01); *G09G 3/3688* (2013.01); *H01L 27/1225* (2013.01); *H01L 27/1255* (2013.01); *G09G 2300/0833* (2013.01); *G09G 2300/0842* (2013.01); *G09G 2300/0866* (2013.01); *G09G 2300/0876* (2013.01); *G09G 2310/0216* (2013.01); *G09G 2310/0251* (2013.01); *G09G 2310/0272* (2013.01); *G09G 2320/0271* (2013.01); *G09G 2320/066* (2013.01); *G09G 2330/023* (2013.01)

(58) Field of Classification Search
CPC ..... G09G 2310/0272; G09G 2320/066; G09G 2320/0271; G09G 2300/0866; G09G 2330/023; G09G 2310/0251; G06F 1/3265; H01L 27/1255; H01L 27/1225
USPC .......................................................... 345/98
See application file for complete search history.

PIXEL CIRCUIT AND DISPLAY DEVICE

CROSS-REFERENCE TO RELATED APPLICATIONS

This application is a National Phase filing under 35 U.S.C. §371 of International Application No. PCT/JP2012/082515 filed on Dec. 14, 2012, and which claims priority to Japanese Patent Application No. 2012-003711 filed on Jan. 12, 2012.

TECHNICAL FIELD

The present invention relates to a pixel circuit and a display device including the pixel circuit, and more particularly to an active matrix liquid crystal display device.

BACKGROUND ART

FIG. 17 shows an equivalent circuit of a pixel circuit of a typical active matrix liquid crystal display device. In addition, FIG. 18 shows a circuit arrangement example of an active matrix liquid crystal display device having m×n pixels. As shown in FIG. 18, a switch element composed of a thin film transistor (TFT) is provided in each of intersecting points of m source lines (data signal lines) and n scanning lines (scanning signal lines), and as shown in FIG. 17, a liquid crystal element LC and a retention capacitor Cs are connected in parallel through the TFT. The liquid crystal element LC is constituted by a laminated structure having a liquid crystal layer between a pixel electrode and an opposed electrode (common electrode). In addition, FIG. 18 shows the simplified pixel circuit only with the TFT and the pixel electrode (black rectangular section). The retention capacitor Cs has one end connected to the pixel electrode, and the other end connected to a capacity line CSL and stabilizes a voltage of pixel data held in the pixel electrode. The retention capacitor Cs prevents a voltage of the pixel data held in the pixel electrode from fluctuating due to a leak current of the TFT, a fluctuation of electric capacity of the liquid crystal element LC between a black display and a white display due to dielectric constant anisotropy of a liquid crystal molecule, and a voltage fluctuation caused through parasitic capacity between the pixel electrode and a peripheral wiring. By sequentially controlling the voltages of the scanning lines, the TFT connected to the one scanning line is set to a conducting state, and the voltage of the pixel data supplied to each source line is written in the corresponding pixel electrode by the scanning line.

In a normal display mode provided in a full-color display, even when display contents are composed of still images, the same display contents are repeatedly written in the same pixel while a polarity of a voltage applied to the liquid crystal element LC is reversed every one frame, so that the voltage of the pixel data held in the pixel electrode is updated, and a voltage fluctuation of the pixel data can be minimized. As a result, high-quality display of the still image can be realized.

Power consumption to drive the liquid crystal display device is dominated by power consumption to drive a source line by a source driver, and can be roughly expressed by a relational expression shown in the following formula 1. In the formula 1, P represents a power consumption, f represents a refresh rate (the number of refresh operations for one frame per unit time), C represent a load capacity driven by the source driver, V represents a drive voltage of the source driver, n represents the number of scanning lines, and m represents the number of source lines. In addition, the refresh operation means an operation to reset a fluctuation generated in the voltage (absolute value), which corresponds to the pixel data and is applied to the liquid crystal element LC, by writing the pixel data again, and restore it to an initial voltage state corresponding to the pixel data.

$$P \propto f \cdot C \cdot V^2 \cdot n \cdot m \qquad \text{(Formula 1)}$$

Recently, along with the widespread of digital contents (such as an advertisement, news, and electronic books) associated with the progress of telecommunications infrastructure, the still image is required to be constantly displayed (a constant display mode), in an image display of the digital contents in a mobile terminal device such as a cell phone, or a mobile internet device (MID). The mobile terminal device which displays the digital contents uses a liquid crystal display device which is low in power consumption, but a time spent displaying the still image accounts for most of the operating time of the device, so that it is further required to reduce the power consumption while the still image is constantly displayed.

When the still image is constantly displayed, it is not always necessary to update the voltage of the pixel data every one frame because the display contents are composed of the still image. Therefore, in order to further reduce the power consumption of the liquid crystal display device, there has been an attempt to reduce a refresh frequency at the time of constantly displaying the still image. However, when the refresh frequency is reduced, the pixel data voltage held in the pixel electrode fluctuates due to the leak current of the TFT, or the like. Furthermore, an average potential during each frame period is also reduced, so that the voltage fluctuation leads to a fluctuation in display brightness of the pixel (transmittance of liquid crystal), and this is observed as a flicker. In addition, deterioration in display quality such that a sufficient contrast cannot be obtained could be caused.

Here, as a method of solving the problem that the display quality deteriorates due to the reduction in refresh frequency when the still image is constantly displayed, a configuration is disclosed in the following patent document 1. According to the configuration disclosed in the patent document 1, as shown in FIG. 19, a voltage reduction compensation circuit VLC is provided in the pixel circuit shown in FIG. 17, so that the reduction in pixel data voltage held in the pixel electrode can be collectively and automatically compensated with respect to each gradation for each pixel in the pixel circuit, without depending on an external refresh operation in which the source line and the scanning line are driven to externally write the pixel data voltage again. Thus, the refresh frequency can be reduced at the time of the constant display mode while the display quality is maintained, and in addition, the source line and the scanning line are kept in a halted state without being driven, so that the power consumption of a liquid crystal display panel can be considerably reduced.

PRIOR ART DOCUMENT

Patent Document

Patent Document 1: WO 2011/052272 A

SUMMARY OF THE INVENTION

Problems to be Solved by the Invention

A circuit configuration and an operation of the voltage reduction compensation circuit VLC disclosed in the patent document 1 will be briefly described. The basic circuit configuration of the voltage reduction compensation circuit VLC, as shown in FIG. 19, includes a switch circuit SC including a series circuit of a transistor T11 and a diode D11, and a control circuit CC which controls a potential of a gate electrode of the transistor T11 and includes a series circuit of a transistor T12 and a boost capacitor C12. An output node N2 of the control circuit CC is provided at a connection point between the transistor T12 and the boost capacitor C12, and is connected to the gate electrode of the transistor T11. One end of the switch circuit SC is connected to a source line SL, and the other end is connected to an internal node N1 connected to the pixel electrode. One end of the control circuit CC beside the transistor T12 is connected to the internal node N1, and the other end beside the boost capacitor C12 is connected to a boost control line BST.

According to the circuit operation of the voltage reduction compensation circuit VLC, in simple terms, the on/off of the transistor T12 is automatically controlled with respect to each gradation, in response to a voltage state held in the internal node N1, so that a voltage change of the output node N2 due to the boost capacitor C12 is controlled, and only for a target gradation, the switch circuit SC is set to a conducting state to supply the pixel data voltage corresponding to the gradation from the source line SL to the internal node N1 through the switch circuit SC, so that the voltage reduction of the internal node N1 is compensated.

However, when the voltage reduction compensation circuit VLC is applied to the full-color display, the voltage control with respect to each gradation is affected by a variation in threshold voltages of the transistors T11 and T12, so that there is a limit in application to a multi-gradation full-color display.

The present invention was made in view of the above problem, and its object is to provide a pixel circuit and a display device which respond to a multi-gradation display, and can prevent display quality from deteriorating with low power consumption.

Means for Solving the Problem

To achieve the object, the present invention provides, as first characteristics, a pixel circuit comprising: a display element unit including a display element in which a display state is changed based on a pixel data voltage held in a pixel node; a first switch circuit for controlling a conducting state between a data signal line and the pixel node based on a signal level of a scanning signal line, and transferring the pixel data voltage supplied from the data signal line to the pixel node; and a memory circuit for storing a hold voltage having a constant relationship with the pixel data voltage in a storage node electrically separated from the pixel node, and restoring a voltage state of the pixel node to the pixel data voltage to be derived from the hold voltage, based on the hold voltage, wherein the memory circuit comprises: a first transistor element having a gate electrode connected to the storage node, and a source electrode connected to the pixel node; a second switch circuit for controlling a conducting state between a drain electrode of the first transistor element, and one of a voltage supply line and a first control signal line, based on a signal level of the first control signal line; a third switch circuit for controlling a conducting state between the drain electrode and the gate electrode of the first transistor element, based on a signal level of one of the scanning signal line and a second control signal line; and a capacitor element interposed between the storage node, and one of the voltage supply line and a fixed voltage line.

Further, in the pixel circuit according to the first characteristics, as second characteristics, the third switch circuit is set to a non-conducting state to make the storage node a floating node, and the hold voltage stored in the storage node is continuously held.

Further, in the pixel circuit according to the first or second characteristics, as third characteristics, the first switch circuit comprises a second transistor element having a drain electrode connected to the data signal line, a source electrode connected to the pixel node, and a gate electrode connected to the scanning signal line, the second switch circuit comprises one of a third transistor element and a diode element, the third transistor element having a drain electrode connected to the voltage supply line, a source electrode connected to the drain electrode of the first transistor element, and a gate electrode connected to the first control signal line, and the diode element having one end connected to the drain electrode of the first transistor element, and the other end connected to the first control signal line, and the third switch circuit comprises a fourth transistor element having a drain electrode connected to the drain electrode of the first transistor element, a source electrode connected to the gate electrode of the first transistor element, and a gate electrode connected to one of the scanning signal line and the second control signal line.

Further, in the pixel circuit according to the third characteristics, preferably, the second transistor element and the fourth transistor element are thin film transistor elements having the same conductivity type, and the gate electrodes of these transistor elements are connected to the scanning signal line, respectively.

Further, in the pixel circuit according to the third characteristics, preferably, at least the fourth transistor element is composed of an oxide semiconductor thin film transistor element.

Further, in the pixel circuit according to the third characteristics, preferably, the display element unit comprises a liquid crystal display element, and the pixel node is connected to a pixel electrode of the liquid crystal display element.

Further, to achieve the above object, the present invention provides, as first characteristics, a display device comprising:

a pixel circuit array in which a plurality of pixel circuits are arranged in each of a row direction and a column direction, each of the pixel circuits is identical to the pixel circuit according to any one characteristics described above, in each of the pixel circuits arranged in the same column, one end of the first switch circuit being connected to the data signal line arranged in the same column and extending in the column direction, in each of the pixel circuits arranged in the same row, a first control terminal for controlling a conducting state of the first switch circuit being connected to the scanning signal line arranged in the same row and extending in the row direction, and a third control terminal for controlling a conducting state of the third switch circuit being connected to the second control signal line arranged in the same row and extending in the row direction, and in each of the pixel circuit arranged in the same row or the same column, one of the other end of the second switch circuit and a second control terminal for controlling a conducting state of the second switch circuit being connected to the common first control signal line; a data signal line drive circuit for driving the data signal line individually; a scanning signal line drive circuit for driving the scanning signal line individually; a first control signal line drive circuit for driving the first control signal line; and a second control signal line drive circuit for driving the second control signal line individually.

Furthermore, in the display device having the above first characteristics, as second characteristics, the second control signal line is combined with the scanning signal line, the third control terminal of the third switch circuit of the pixel circuit arranged in the same row is connected to the common scanning signal line, and the second control signal line and the second control signal line drive circuit are not provided.

Further, in the display device according to the first characteristics, as third characteristics, in a memory operation for simultaneously executing an operation of individually writing pixel data having two or more gradations and an operation of storing the hold voltage in the storage node by applying the pixel data voltage to the pixel node, in each of the pixel circuits arranged in one selected row, throughout an operation period of the memory operation, the second control signal line drive circuit applies a predetermined first control selected row voltage to the second control signal line in the selected row to set the third switch circuit of the pixel circuit arranged in the selected row to a conducting state, and applies a predetermined first control unselected row voltage to the second control signal line in unselected row to set the third switch circuit of the pixel circuit arranged in the unselected row to a non-conducting state, during a preprocessing period just after a start of the operation period, the first control signal line drive circuit applies a predetermined first initialization control voltage to the first control signal line to set the second switch circuit to a conducting state and initialize the storage node of the pixel circuit arranged in the selected row to a predetermined first initialization voltage, during at least a real processing period after the preprocessing period of the operation period in the operation period of the memory operation, the scanning signal line drive circuit applies a predetermined first scan selected row voltage to the scanning signal line in the selected row to set the first switch circuit of the pixel circuit arranged in the selected row to a conducting state, and applies a predetermined first scan unselected row voltage to the scanning signal line in the unselected row to set the first switch circuit of the pixel circuit arranged in the unselected row to a non-conducting state, and the data signal line drive circuit applies the pixel data voltage to the data signal line individually, and during the real processing period of the operation period, the first control signal line drive circuit applies a predetermined writing control voltage to the first control signal line to set the second switch circuit to a non-conducting state, and stores the hold voltage in the storage node of the pixel circuit arranged in the selected row.

Here, the selected row means a group of a series of selected pixel circuits connected to the one selected scanning signal line and the one selected second control signal line. Therefore, the scanning signal line in the selected row means the one selected scanning signal line connected to each of the selected pixel circuits, and the second control signal line in the selected row means the one selected second control signal line connected to each of the selected pixel circuits.

Further, in the display device according to the second characteristics, as fourth characteristics, in a memory operation for simultaneously executing an operation of individually writing pixel data having two or more gradations and an operation of storing the hold voltage in the storage node by applying the pixel data voltage to the pixel node, in each of the pixel circuits arranged in one selected row, throughout an operation period of the memory operation, the scanning signal line drive circuit applies a predetermined first selected row voltage to the scanning signal line in the selected row to set the first switch circuit and the third switch circuit of the pixel circuit arranged in the selected row to a conducting state, and applies a predetermined first unselected row voltage to the scanning signal line in unselected row to set the first switch circuit and the third switch circuit of the pixel circuit arranged in the unselected row to a non-conducting state, and the data signal line drive circuit applies the pixel data voltage to the data signal line individually, during a preprocessing period just after a start of the operation period, the first control signal line drive circuit applies a predetermined first initialization control voltage to the first control signal line to set the second switch circuit to a conducting state and initializes the storage node of the pixel circuit arranged in the selected row to a predetermined second initialization voltage, and during a real processing period after the preprocessing period of the operation period, the first control signal line drive circuit applies a predetermined writing control voltage to the first control signal line to set the second switch circuit to a non-conducting state, and stores the hold voltage in the storage node of the pixel circuit arranged in the selected row.

Here, the selected row means a group of a series of selected pixel circuits connected to the one selected scanning signal line. Therefore, the scanning signal line in the selected row means the one selected scanning signal line connected to each of the selected pixel circuits.

Further, in the display device according to the first or third characteristics, as fifth characteristics, in a restore operation to restore a voltage state of the pixel node to the pixel data voltage corresponding to the hold voltage, based on the hold voltage stored in the storage node of the pixel circuit, the scanning signal line drive circuit applies a predetermined second scan selected row voltage to all of the scanning signal lines to set the first switch circuits of all of the pixel circuits to the conducting state, the second control signal line drive circuit applies a predetermined second control unselected row voltage to all of the second control signal lines to set the third switch circuits of all of the pixel circuits to the non-conducting state, and the data signal line drive circuit applies a predetermined second initialization control voltage to all of the data signal lines to initialize the voltage state of the pixel nodes of all of the pixel circuits through the first switch circuits, with the third switch circuit maintained in the non-conducting state, and then the scanning signal line drive circuit applies a predetermined second scan unselected row voltage to all of the scanning signal lines to set the first switch circuits of all of the pixel circuits to the non-conducting state, and during a given period after the first switch circuit has been set to the non-conducting state, or throughout the restore operation, the first control signal line drive circuit applies a predetermined restore control voltage to the first control signal line to set the second switch circuit to the conducting state, and restores the initialized voltage state of the pixel node to the pixel data voltage corresponding to the hold voltage stored in the storage node.

Furthermore, as for the display device having the second or the fourth characteristics, as sixth characteristics, in a restore operation to restore a voltage state of the pixel node to the pixel data voltage corresponding to the hold voltage, based on the hold voltage stored in the storage node of the pixel circuit, the scanning signal line drive circuit applies the unselected row voltage to all of the scan signal lines to set the first switch circuits and the third switch circuits of all of the pixel circuits to the non-conducting state, the control signal line drive circuit applies a predetermined restore control voltage to the first control signal line to set the second switch circuit to the conducting state, and the data signal line drive circuit applies a predetermined third initialization control voltage to all of the data signal lines to set the first switch circuit from the non-conducting state to the conducting state under the condition that the second unselected row voltage is applied to the first control terminal of the first switch circuit, and initializes the voltage state of the pixel nodes of all of the pixel circuits through the first switch circuits, with maintaining the third switch circuit in the non-conducting state, and subsequently returns the data signal line to the state before the third initialization control voltage is applied, to set the first switch circuit to the non-conducting state, and restores the initialized voltage state of the pixel node to the pixel data voltage corresponding to the hold voltage stored in the storage node.

Further, in the display device according to any one of the first, third and fifth characteristics, as seventh characteristic, in a reset operation to reset the pixel data voltage held in the pixel nodes of all of the pixel circuits to a predetermined reset voltage, the scanning signal line drive circuit applies a predetermined third scan selected row voltage to all of the scanning signal lines to set the first switch circuits of all of the pixel circuits to the conducting state, the second control signal line drive circuit applies a predetermined third control unselected row voltage to all of the second control signal lines to set the third switch circuits in all of the pixel circuits to the non-conducting state, and the data signal line drive circuit applies the reset voltage to all of the data signal lines to set the voltage of the pixel nodes of all of the pixel circuits to the reset voltage, with the third switch circuit kept in the non-conducting state, and subsequently the scanning signal line drive circuit applies a predetermined third scan unselected row voltage to all of the scanning signal lines to set the first switch circuits in all of the pixel circuits to the non-conducting state.

Further, in the display device according to seventh characteristics, as eighth characteristics, in the case where the display element unit of the pixel circuit comprises a liquid crystal display element, and the pixel node is connected to the pixel electrode of the liquid crystal display element, in the reset operation, the data signal line drive circuit applies the same voltage as the voltage applied to an opposed electrode of the liquid crystal display element, to all of the data signal lines as the reset voltage, to provide a non-biased state in which the voltage is not applied between the pixel electrode and the opposed electrode of the liquid crystal display element.

Effect of the Invention

According to the pixel circuit and the display device having the above characteristics, in each display mode of the normal display mode and the constant display mode, the pixel data can be written from the data signal line to the pixel node with using the first switch circuit. That is, in the pixel circuit, the conducting/non-conducting of the transistor element constituting the first switch circuit is externally controlled through the scanning signal line, and the voltage to be supplied to the data signal line is externally controlled, so that the pixel data voltage held in the pixel node of the pixel circuit can be controlled. Therefore, the externally controlled refresh operation of the pixel data voltage can be performed by the writing operation of the pixel data as a matter of course.

In addition, in the case where the color display is provided such that one pixel is displayed with three primary colors, the pixel circuit of the present invention serves as a sub-pixel corresponding to each color of the three primary colors (RGB), as a minimum display unit. Therefore, in this case of the color display, the pixel data corresponds to gradation data of each of the three primary colors.

Furthermore, according to the pixel circuit and the display device having the above characteristics, the hold voltage having the constant relationship with the pixel data voltage is stored in the storage node, in the memory circuit of the pixel circuit. More specifically, along with the above writing operation, both of the second and third switch circuits of the memory circuit are set to the conducting state to initialize the storage node to the predetermined first initialization voltage, and then only the second switch circuit is set to the non-conducting state, so that the drain electrode and the gate electrode of the first transistor element are connected through the third switch circuit in the memory circuit, and the first transistor element serves as the diode. When the conductivity type of the first transistor element is an n type, the diode is formed such that an anode is connected to the storage node, and a cathode is connected to the pixel node, while when the conductivity type of the first transistor element is a p type, the diode is formed such that the anode is connected to the pixel node, and the cathode is connected to the storage node. In either case, a turn-on voltage of the diode is equal to a threshold voltage of the first transistor element. Therefore, if the first initialization voltage is previously set so that a voltage difference between the first initialization voltage of the storage node and the pixel data voltage to be held in the pixel node becomes greater than the turn-on voltage of the diode regardless of the pixel data, while the pixel node is driven at the pixel data voltage, and the diode is in the on state in the writing operation, the voltage of the storage node reduces from the first initialization voltage toward the pixel data voltage held in the pixel node until the diode is turned off in the case where the conductivity type of the first transistor element is the n type, meanwhile the voltage of the storage node rises from the first initialization voltage toward the pixel data voltage held in the pixel node until the diode is turned off in the case where the conductivity type is the p type. As a result, the hold voltage having the constant relationship with the pixel data voltage written in the pixel node in the writing operation is stored in the storage node, that is, the hold voltage is higher in the case where the conductivity type of the first transistor element is the n type, while it is lower in the case where the conductivity type is the p type, by the threshold voltage of the first transistor element. Therefore, only by switching the conducting/non-conducting of the second switch circuit along with the writing operation, the hold voltage having the constant relationship with the pixel data voltage is stored in the storage node. After the hold voltage has been stored in the storage node, the third switch circuit is also set to the non-conducting state, so that the storage node is in a floating state, and the charges corresponding to the hold voltage can be continuously held.

Here, in the case where the pixel data voltage held in the pixel node has fluctuated by some factor or operation, the voltage of the pixel node is initialized from a side of the data signal line through the first switch circuit with the third switch circuit set in the non-conducting state and then the first switch circuit is set to the non-conducting state, so that in the case where the second switch circuit has been already set to the conducting state, or when the second switch circuit is set to the conducting state, a current flows from the side of the second switch circuit to the pixel node through the first transistor element in the case where the conductivity type of the first transistor element is the n type. As a result, the pixel node can be charged to the voltage which is lower than the hold voltage stored in the storage node by the threshold voltage of the first transistor element, so that the voltage state of the pixel node can be restored to the pixel data voltage before the fluctuation. In addition, in the case where the conductivity type of the first transistor element is the p type, a current flows from the pixel node toward the second switch circuit through the first transistor element, so that the pixel node can be discharged to the voltage which is higher than the hold voltage stored in the storage node by the threshold voltage of the first transistor element, so that the voltage state of the pixel node can be restored to the pixel data voltage before the fluctuation.

Here, it is to be noted that since the hold voltage stored in the storage node is higher or lower by the threshold voltage of the first transistor element in the pixel circuit, the variation of the threshold voltage of the first transistor element is previously compensated, so that the pixel data voltage restored based on the hold voltage is not affected by the threshold voltage of the first transistor element. As a result, according to the pixel circuit and the display device having the above characteristics, the still image in the full-color display can be stored in the pixel circuit, so that it is possible to provide the pixel circuit and the display device which support the multi-gradation display and can prevent the display quality from deteriorating with low power consumption.

Furthermore, when the third switch circuit comprises an oxide semiconductor thin film transistor element in which a leak current is small in the off-state, compared with a polycrystalline silicon thin film transistor or an amorphous silicon thin film transistor, the voltage fluctuation of the hold voltage stored in the memory node in the floating state can be considerably prevented. As a result, for example, even in the case where the voltage of the pixel node extremely fluctuates, such as a case where after power supply of the display device has been turned off and the non-display state has been kept for a long time, it is turned on and the display state is to be restored, the original display state can be restored with high precision. In addition, since the original display state is stored in the pixel circuit, a storage device for externally storing the display state is not needed and a circuit configuration of the display device as a whole can be simplified. In addition, it is possible to save time and power consumption required to write and read the display data in the external storage device for restoring the original display state.

Furthermore, when the scanning signal line and the second control signal line are combined, and both of the signal lines are unified, the number of the signal lines connected to the pixel circuit can be reduced by one, so that an aperture ratio of the pixel can be prevented from being reduced due to the wiring of the signal line, and a peripheral circuit to drive the signal line can be simplified.

Meanwhile, in the case where the second control signal line and the scanning signal line are separately provided, the conducting/non-conducting of the first switch circuit and the third switch circuit can be individually controlled, respectively, that is, the pixel circuit unit having the conventional configuration including the display element unit and the first switch circuit, and the memory circuit can be individually controlled, respectively, so that the pixel circuit unit can be used alone apart from the memory circuit while the hold voltage is kept stored in the memory circuit. For example, a hold voltage corresponding to a display state of a certain still image is stored in the storage node of the pixel circuit once, and under the condition that the third switch circuit is maintained in the non-conducting state, after the data signal line and the scanning signal line has been driven to write pixel data of a new still image or a moving image in the pixel node of the pixel circuit and the still image or the moving image has been normally displayed, or after a display element of the pixel circuit has been set to the non-display state, when the restore operation is performed for the pixel node based on the hold voltage stored in the storage node, the original still image can be restored.

EMBODIMENTS FOR CARRYING OUT THE INVENTION

Hereinafter, each embodiment of a pixel circuit and a display device in the present invention will be described with reference to the drawings.

First Embodiment

In the first embodiment, a description will be given to the display device in the present invention (hereinafter, referred to as the display device simply) and a circuit configuration of the pixel circuit in the present invention (hereinafter, referred to as the pixel circuit simply).

Figure 1:
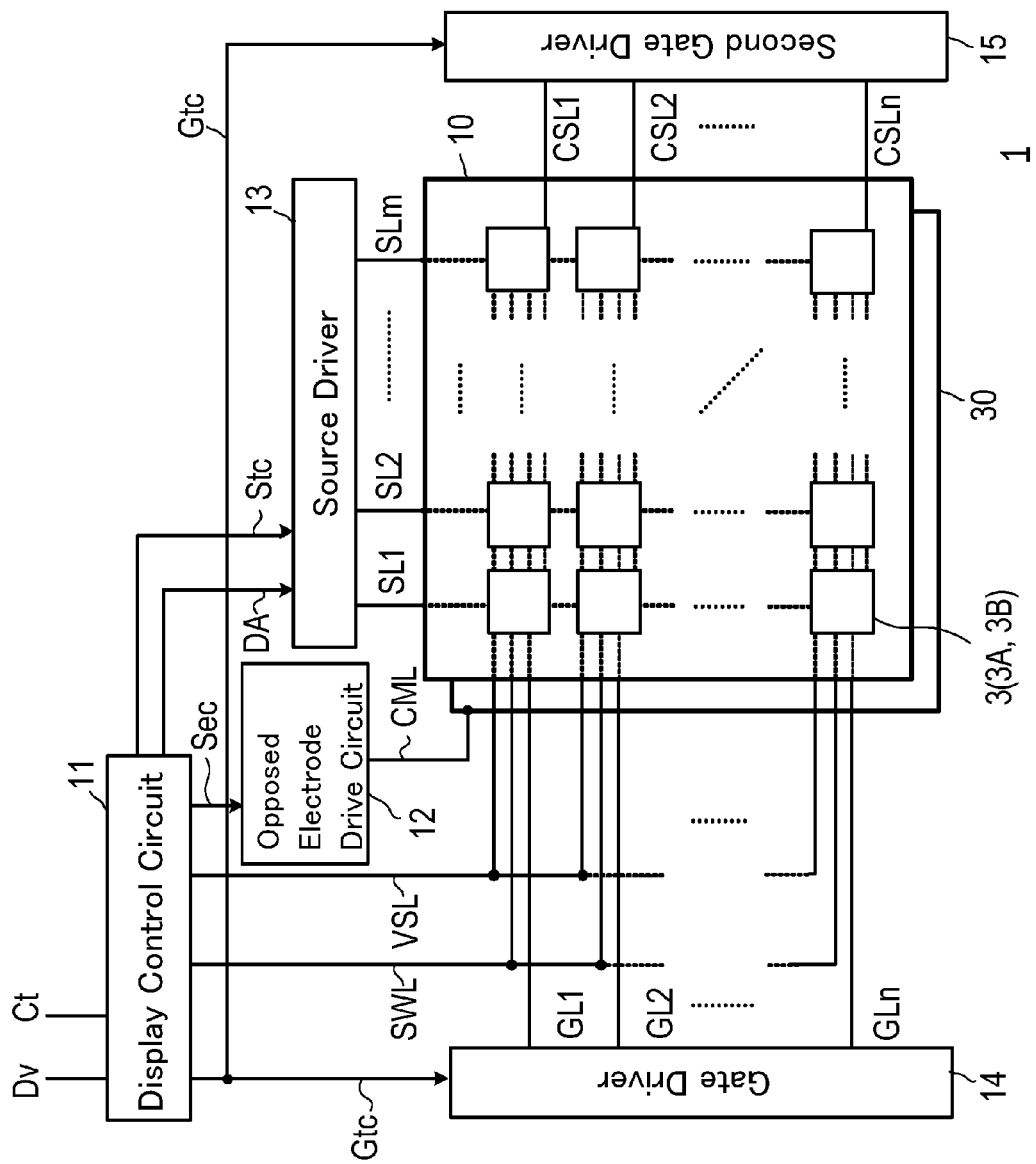
FIG. 1 is a block diagram showing one example of a schematic configuration of a display device in the present invention.
Figure 2:
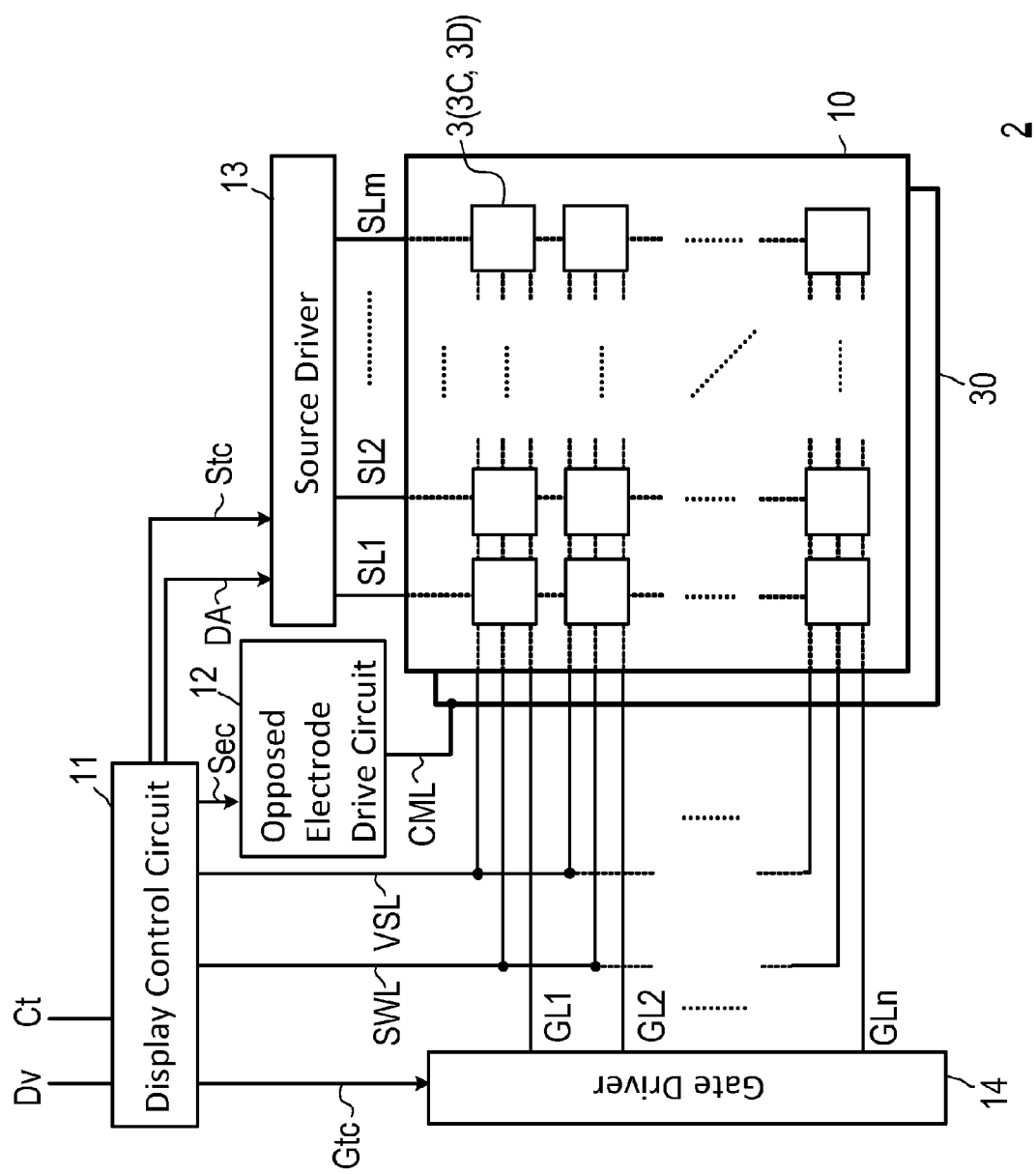
FIG. 2 is a block diagram showing another example of the schematic configuration of the display device in the present invention.

FIGS. 1 and 2 show schematic configurations of two display devices 1 and 2, respectively. According to the present embodiment, four kinds (type A to type D) of pixel circuits 3A to 3D, which will be described below, are assumed as the pixel circuit, in which the display device 1 shown in FIG. 1 includes the pixel circuit 3A or 3B, and the display device 2 shown in FIG. 2 includes the pixel circuit 3C or 3D. Hereinafter, the pixel circuits 3A to 3D are collectively referred to as the pixel circuit 3.

Each of the display devices 1 and 2 includes an active matrix substrate 10, an opposed electrode 30, a display control circuit 11, an opposed electrode drive circuit 12, a source driver 13, a gate driver 14, and various signal lines which will be described below, and the display device 1 further includes a second gate driver 15. On the active matrix substrate 10, the plurality of the pixel circuits 3 are arranged in each of a row direction and a column direction so that a pixel circuit array is formed. In addition, in FIGS. 1 and 2, the pixel circuit 3 is shown as a block to simplify the drawing. In addition, in FIGS. 1 and 2, in order to clearly show that the various signal lines are formed on the active matrix substrate 10, the active matrix substrate 10 is shown so as to be positioned above the opposed electrode 30 for the sake of convenience.

According to the present embodiment, each of the display devices 1 and 2 has a configuration in which a screen display can be implemented with the same pixel circuit 3 in two display modes such as a normal display mode and a constant display mode. The normal display mode is a display mode in which a moving image or a still image is displayed by full-color display, and uses a transmissive liquid crystal display using a backlight. In the normal display mode, a memory function of the pixel circuit 3 which will be described below is not used. Meanwhile, the constant display mode in the present embodiment is a display mode in which a multi-gradation display is provided by the pixel circuit (the same full-color display as that of the normal display mode is assumed in the present embodiment), such that each color of three primary colors (R, G, B) is allocated to each of the three adjacent pixel circuits 3, and a still image is displayed by the full-color display. In addition, the constant display mode in the present embodiment is a technique which can be used in each of the transmissive liquid crystal display and a reflective liquid crystal display.

In addition, in the following description, for the sake of convenience, a minimum display unit corresponding to one pixel circuit 3 is referred to as the "pixel", and "pixel data" to be written in each pixel circuit is gradation data of each color, in the case of the color display with the three primary colors (R, G, B). In addition, in the case where the color display includes another color (such as yellow) and brightness data of black and white in addition to the three primary colors, the gradation data of the other color and the brightness data are also included in the pixel data.

As will be described below, each of the display devices 1 and 2 is characterized in that a memory operation and a restore operation which will be described below can be performed when the still image is displayed in the constant display mode, and power consumption can be considerably low compared to the case where a conventional "refresh operation" is executed, and it can be applied to a configuration in which the liquid crystal display is performed using only the constant display mode without using both of the normal display mode and the constant display mode, as a matter of course.

Figure 3:
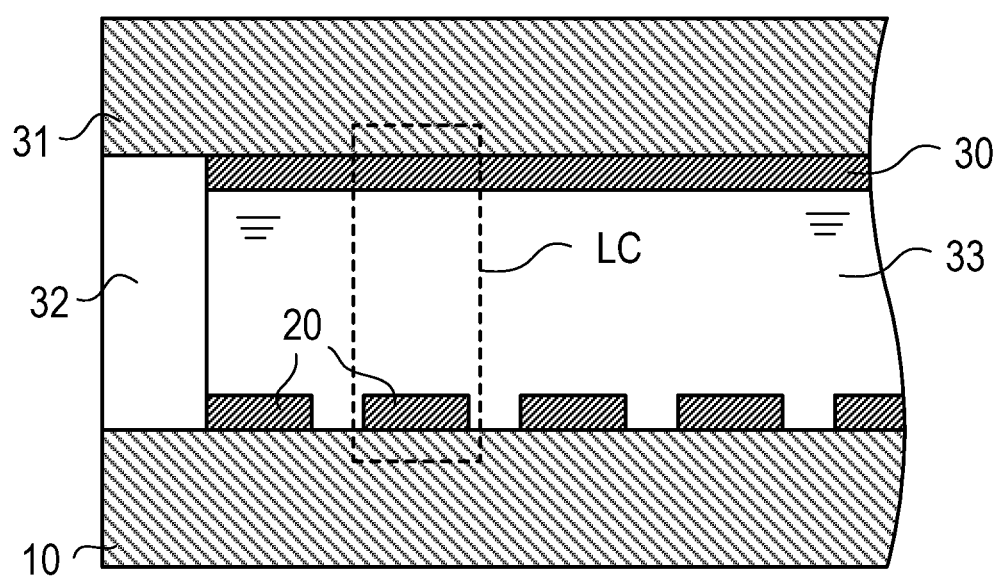
FIG. 3 is an essential part cross-sectional view showing one example of a schematic configuration of a display element unit of a liquid crystal display device.

FIG. 3 is a schematic cross-sectional structure diagram showing a relationship between the active matrix substrate 10 and the opposed electrode 30, and shows a structure of a display element unit 21 (refer to FIG. 3) serving as one constituent component of the pixel circuit 3. The active matrix substrate 10 is a light-transmissive transparent substrate and composed of glass or plastic, for example. As shown in FIGS. 1 and 2, the pixel circuit 3 is formed on the active matrix substrate 10 together with several signal lines. FIG. 3 shows a pixel electrode 20 as a representative of the constituent components of the pixel circuit 3. The pixel electrode 20 is composed of light-transmissive transparent conductive material such as ITO (indium tin oxide).

A light-transmissive opposed substrate 31 is arranged so as to be opposed to the active matrix substrate 10, and a liquid crystal layer 33 is held between these substrates. A polarization plate (not shown) is attached to an outer surface of each of the substrates.

The liquid crystal layer 33 is sealed with a sealing material 32 in peripheral parts of the substrates. The opposed electrode 30 composed of light-transmissive transparent conductive material such as ITO is formed on the opposed substrate 31 so as to be opposed to the pixel electrode 20. The opposed electrode 30 is formed as a single film so as to spread almost all over a surface of the opposed substrate 31. Here, it is to be noted that a unit liquid crystal display element LC (refer to FIGS. 4 to 7) is formed of the one pixel electrode 20, the opposed electrode 30, and the liquid crystal layer 33 held therebetween.

In addition, a backlight device (not shown) is arranged on a back side of the active matrix substrate 10, and light can be emitted from the active matrix substrate 10 toward the opposed substrate 31.

As shown in FIGS. 1 and 2, the plurality of signal lines are formed on the active matrix substrate 10 in a vertical and a horizontal directions. The plurality of the pixel circuits 3 are arranged in the shape of a matrix and are formed at intersecting points of m source lines (SL1, SL2, . . . , SLm) extending in the vertical direction (column direction), and n gate lines (GL1, GL2, . . . , GLn) extending in the horizontal direction (row direction) so that the pixel circuit array is formed. In addition, m and n each is a natural number of 2 or more. A voltage corresponding to an image to be displayed is applied to the pixel electrode 20 formed in the pixel circuit 3 from the source driver 13 and the gate driver 14 through the source line SL and the gate line GL, respectively. In addition, for the sake of convenience, the source lines (SL1, SL2, . . . , SLm) are collectively referred to as the source line SL, and the gate lines (GL1, GL2, . . . , GLn) are collectively referred to as the gate line GL.

Here, the source line SL corresponds to a "data signal line", and the gate line GL corresponds to a "scanning signal line". The source driver 13 and the gate driver 14 correspond to a "data signal line drive circuit", and a "scanning signal line drive circuit", respectively.

In the present embodiment, as signal lines to drive the pixel circuit 3, a first control signal line SWL and a voltage supply line VSL are provided in addition to the source line SL and the gate line GL. The voltage supply line VSL is driven by the display control circuit 11, as one example. A part of the display control circuit 11 corresponds to a "first control signal line drive circuit". Furthermore, the display device 1 shown in FIG. 1 further includes a second control signal line CSL as the signal line to drive the pixel circuits 3A and 3B. In addition, a predetermined fixed voltage is supplied to the voltage supply line VSL such that a first initialization voltage which will be described below is supplied to the pixel circuits 3A and 3C, while any fixed voltage (such as a ground voltage) is supplied to the pixel circuits 3B and 3D.

Furthermore, in the configuration shown in FIGS. 1 and 2, each of the first control signal line SWL and the voltage supply line VSL is provided for each row so as to extend in the row direction, and the wirings of the rows are connected to each other and unified in a periphery of the pixel circuit array, and each of them is driven by the display control circuit 11. In addition, since both of the first control signal lines SWL and the voltage supply lines VSL are unified in the periphery of the pixel circuit array, at least one of them may be provided with respect to each column so as to extend in the column direction instead of extending in the row direction, or the one first control signal line SWL or the one voltage supply line VSL may be shared by the pixel circuits 3 in the two adjacent rows or two adjacent columns.

In addition, in the configuration shown in FIG. 1, each of the second control signal lines CSL (CSL1, CSL2, . . . , CSLn) is provided with respect to each row, and the wiring in each row is individually driven by the second gate driver 15. The second gate driver 15 corresponds to a "second control signal line drive circuit". In addition, as another configuration, the gate driver 14 and the second gate driver 15 may be unified, and the gate line GL and the second control signal line CSL in each row may be driven by the unified gate driver 14 and second gate driver 15.

The display control circuit 11 serves as a circuit which controls a writing operation in the normal display mode, and a memory operation, a restore operation, and a reset operation which will be described below, in the constant display mode. In the writing operation, the display control circuit 11 receives a data signal Dv showing an image to be displayed and a timing signal Ct from an external signal source, and based on the signals Dv and Ct, it creates signals for displaying the image in the display element unit 21 in the pixel circuit array such as a digital image signal DA and a data-side timing control signal Stc to be applied to the source driver 13, a scan-side timing control signal Gtc to be applied to the gate driver 14, an opposed voltage control signal Sec to be applied to the opposed electrode drive circuit 12, and a signal voltage and a fixed voltage applied to the first control signal line SWL and the voltage supply line VSL, respectively. Furthermore, in order to perform a process corresponding to the operation mode and the pixel circuit type of the pixel circuit 3, the display control circuit 11 applies a first control signal having a predetermined timing and a predetermined voltage amplitude corresponding to the operation mode and the pixel circuit type, to the first control signal line SWL, and applies a fixed voltage corresponding to the operation mode and the pixel circuit type, to the voltage supply line VSL (which will be described in detail below) in the memory operation, the restore operation, and the reset operation. In addition, it is also preferable that the display control circuit 11 is partially or wholly formed in the source driver 13 or the gate driver 14.

The source driver 13 is a circuit which is controlled by the display control circuit 11 and applies a source signal having a predetermined timing and a predetermined voltage value, to each source line SL in the writing operation, the memory operation, the restore operation, and the reset operation. In the writing operation and the memory operation, the source driver 13, based on the digital image signal DA and the data-side timing control signal Stc, generates voltages each corresponding to a pixel value for one display line shown by the digital signal DA and appropriate to a voltage level of an opposed voltage Vcom, as source signals Sc1, Sc2, . . . , Scm, every one horizontal period (also referred to as a "one H period"). These voltages are multi-gradation analog voltages (voltage values are apart from each other) corresponding to the normal display mode and the constant display mode. Thus, these source signals are applied to the corresponding source lines SL1, SL2, . . . , SLm. In addition, in the restore operation and the reset operation, the source driver 13 applies a voltage corresponding to the operation mode and the type of the pixel circuit 3 to all of the source lines SL connected to the targeted pixel circuits 3 under control by the display control circuit 11 (which will be described in detail below).

The gate driver 14 is a circuit which is controlled by the display control circuit 11, and applies a gate signal having a predetermined timing and a predetermined voltage amplitude corresponding to the operation mode and the type of the pixel circuit 3 to each gate line GL, in each operation. In the writing operation and the memory operation, the gate driver 14 sequentially selects the gate lines GL1, GL2, . . . , GLn roughly every one horizontal period, in each frame period of the digital image signal DA, in order to write the source signals Sc1, Sc2, . . . , Scm in the respective pixel circuits 3, based on the scan-side timing control signal Gtc. In addition, in the restore operation and the reset operation, the gate driver 14 applies the same gate signal having a predetermined timing and a predetermine voltage amplitude corresponding to the operation mode and the type of the pixel circuit 3 to all of the gate lines GL under control by the display control circuit 11 (which will be described in detail below). In addition, the gate driver 14 may be formed on the active matrix substrate 10 similar to the pixel circuit 3.

The second gate driver 15 in the display device 1 is a circuit which is controlled by the display control circuit 11, and in the memory operation, the restore operation, and the reset operation, applies a second control signal having a predetermined timing and a predetermined voltage amplitude corresponding to the operation mode and the type of the pixel circuit 3, to each second control signal line CSL. The second gate driver 15, in the memory operation, sequentially selects the second control signal lines CSL1, CSL2, . . . , CSLn roughly every one horizontal period, in each frame period of the digital image signal DA, based on the scan-side timing control signal Gtc. In addition, in the restore operation and the reset operation, the second gate driver 15 applies the same second control signal having a predetermined timing and a predetermined voltage amplitude corresponding to the operation mode and the type of the pixel circuit 3 to all of the second control signal lines CSL under control by the display control circuit 11 (which will be described in detail below). In addition, the second gate driver 15 may be formed on the active matrix substrate 10 similar to the pixel circuit 3.

The opposed electrode drive circuit 12 applies the opposed voltage Vcom to the opposed electrode 30 through an opposed electrode wiring CML. In the present embodiment, the opposed electrode drive circuit 12 outputs the opposed voltage Vcom which is fixed on a predetermined intermediate voltage (such as 4 V) in the normal display mode and the constant display mode. Furthermore, in the present embodiment, an "opposed AC drive" in which the opposed voltage Vcom is changed every one frame period is not employed.

However, when the voltage having the same polarity is kept applied between the opposed electrode 30 and the pixel electrode 20, burn-in of the display screen (screen burn-in) is generated, so that a polarity reverse operation is needed. Thus, according to the present embodiment, as a remedy, the voltage polarity provided on the basis of the opposed voltage Vcom of the pixel data voltage to be applied to the pixel electrode 20 is reversed every one frame period.

Next, configurations of the pixel circuits 3A to 3D will be described with reference to FIGS. 4 to 7.

<<Pixel Circuit Having Type A>>

Figure 4:
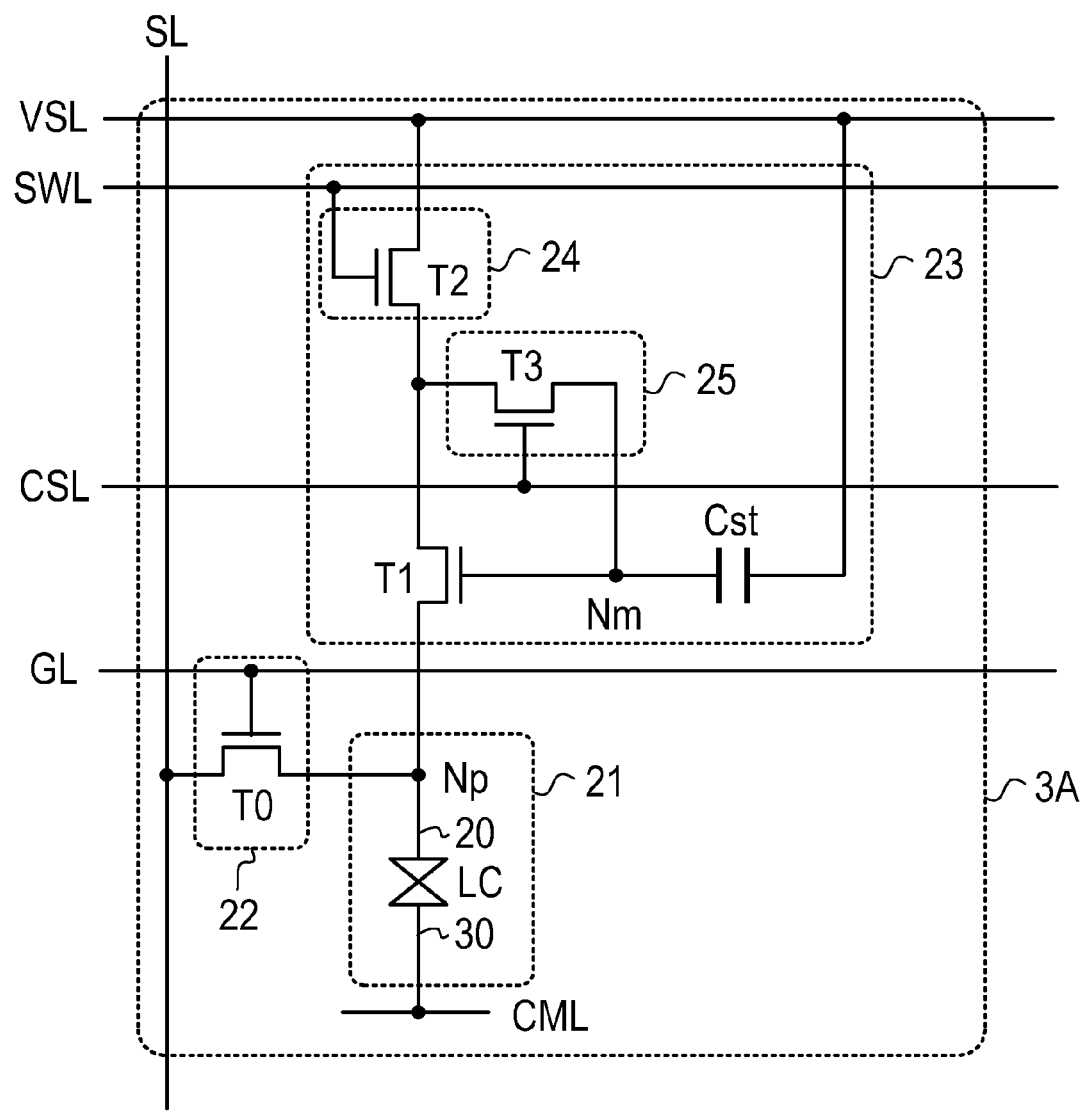
FIG. 4 is a circuit diagram showing one circuit configuration example (type A) of a pixel circuit in the present invention.
Figure 17:
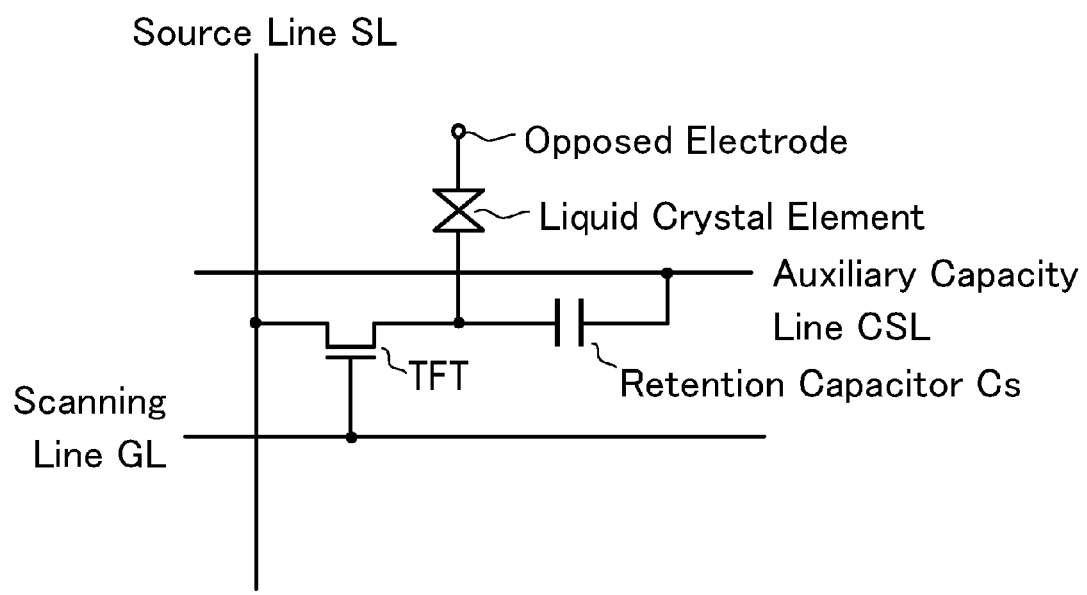
FIG. 17 is an equivalent circuit diagram of a pixel circuit of a general active matrix liquid crystal display device.
Figure 18:
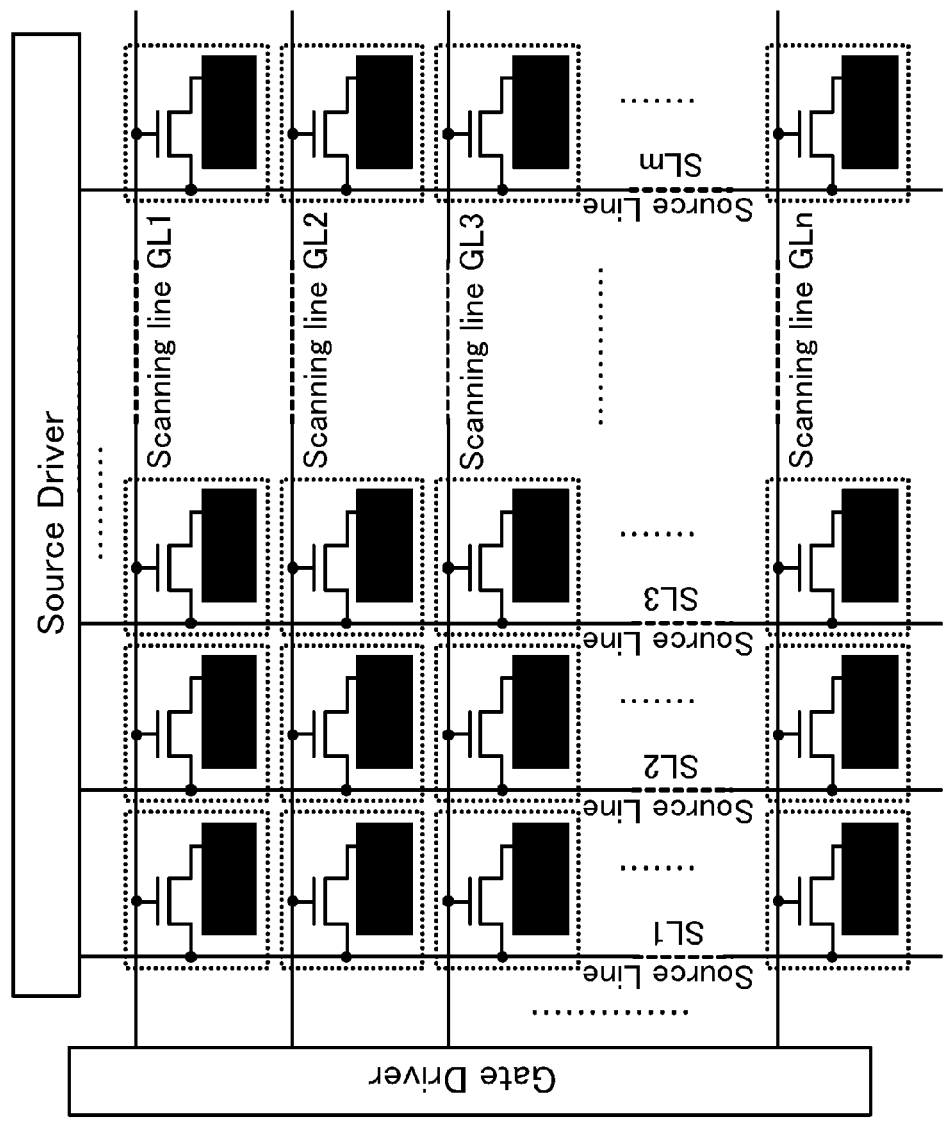
FIG. 18 is a block diagram showing a circuit arrangement example of an active matrix liquid crystal display device having m×n pixels.

FIG. 4 shows a basic circuit configuration of the pixel circuit 3A having the type A. The pixel circuit 3A is configured with the display element unit 21 including the unit liquid crystal display element LC, a first switch circuit 22, and a memory circuit 23. A pixel node Np is formed such that the pixel electrode 20 of the display element unit 21, one end of the first switch circuit 22, and one end of the memory circuit 23 are connected to each other. In addition, each pixel circuit 3 in the present embodiment does not include an auxiliary capacitor element which is provided in a typical pixel circuit shown in FIG. 17, but as another circuit configuration, the auxiliary capacitor element may be provided. The unit liquid crystal display element LC has been described with reference to FIG. 2, so that its description is omitted.

The first switch circuit 22 is a circuit which controls a conducting state between the source line SL and the pixel node Np, based on a signal level of the gate line GL, and transfers a pixel data voltage Vpd supplied from the source line SL, to the pixel node Np. In the present embodiment, as shown in FIG. 4, the first switch circuit 22 is composed of a single thin film transistor T0 in which a drain electrode, a source electrode, and a gate electrode of the transistor T0 are connected to the source line SL, the pixel node Np, and the gate line GL, respectively. However, the first switch circuit 22 may be composed of a series circuit of a plurality of thin film transistors for example, other than the configuration shown in FIG. 4.

The memory circuit 23 is composed of a thin film transistor T1, a second switch circuit 24, a third switch circuit 25, and a capacitor element Cst. The memory circuit 23 is a circuit which stores a hold voltage Vhd (=Vpd+Vt1) which is higher than the pixel data voltage Vpd held in the pixel node Np by a threshold voltage Vt1 of the thin film transistor T1, in a storage node Nm which is electrically separated from the pixel node Np, has a function to restore a voltage state of the pixel node Np to the pixel data voltage Vpd derived from the hold voltage Vhd, based on the hold voltage Vhd, and is used in the memory operation, the restore operation, and the reset operation in the constant display mode.

The thin film transistor T1 has a drain electrode, a source electrode, and a gate electrode connected to one end of the second switch circuit 24, the pixel node Np, and the storage node Nm, respectively.

The second switch circuit 24 is a circuit which controls a conducting state between the drain electrode of the thin film transistor T1 and the voltage supply line VSL, based on a signal level of the first control signal line SWL. In the present embodiment, as shown in FIG. 4, the second switch circuit 24 is composed of a single thin film transistor T2 in which a drain electrode, a source electrode, and a gate electrode of the transistor T2 are connected to the voltage supply line VSL, the drain electrode of the thin film transistor T1, and the first control signal line SWL, respectively. In addition, the second switch circuit 24 may be composed of a series circuit of a plurality of thin film transistors for example, other than the configuration shown in FIG. 4.

The third switch circuit 25 is a circuit which controls a conducting state between the drain electrode and the gate electrode of the thin film transistor T1, based on the signal level of the gate line GL. In the present embodiment, as shown in FIG. 4, the third switch circuit 25 is composed of a single thin film transistor T3 in which a drain electrode, a source electrode, and a gate electrode of the transistor T3 are connected to the drain electrode of the thin film transistor T1, the storage node Nm, and the second control signal line CSL, respectively.

In the present embodiment, one end and the other end of the capacitor element Cst are connected to the storage node Nm, and the voltage supply line VSL, respectively. The capacitor element Cst is provided to hold the hold voltage Vhd stored in the storage node Nm stably for a long time. The capacitor element Cst may take various shapes such as a parallel plate type capacitor in which a gate electrode material forming the gate electrode of the thin film transistor T1 and a wiring material film forming the voltage supply line VSL are opposed across a thin insulating film, and a capacitor provided based on gate capacity of a thin film transistor. In addition, other than the capacitor element Cst, gate capacity of the thin film transistor T1, parasitic capacity between the gate electrode and the source electrode of the thin film transistor T3, and the like are parasitic in the storage node Nm, so that the total capacity contributes to charge storage corresponding to the hold voltage Vhd. In addition, the other end of the capacitor element Cst may be connected to a voltage line to supply another fixed voltage, instead of the voltage supply line VSL.

According to the present embodiment, it is assumed that each of the four thin film transistors T0 to T3 constituting the pixel circuit 3A is formed of an n-channel oxide semiconductor thin film transistor, and especially, InGaZnO is assumed as an oxide semiconductor. The four thin film transistors T0 to T3 are not always required to be formed of the oxide semiconductor thin film transistor, but a leak current at an off time of the oxide semiconductor thin film transistor is smaller than that of a polycrystalline silicon thin film transistor or an amorphous silicon thin film transistor, so that the oxide semiconductor thin film transistor is especially effective in preventing a leak current of the thin film transistor T3 having the source electrode connected to the storage node Nm. In the following description, it is assumed that each of the threshold voltages of the four thin film transistors T0 to T3 is 2 V (standard value having a voltage variation of 0 V) for the sake of convenience.

<<Pixel Circuit Having Type B>>

Figure 5:
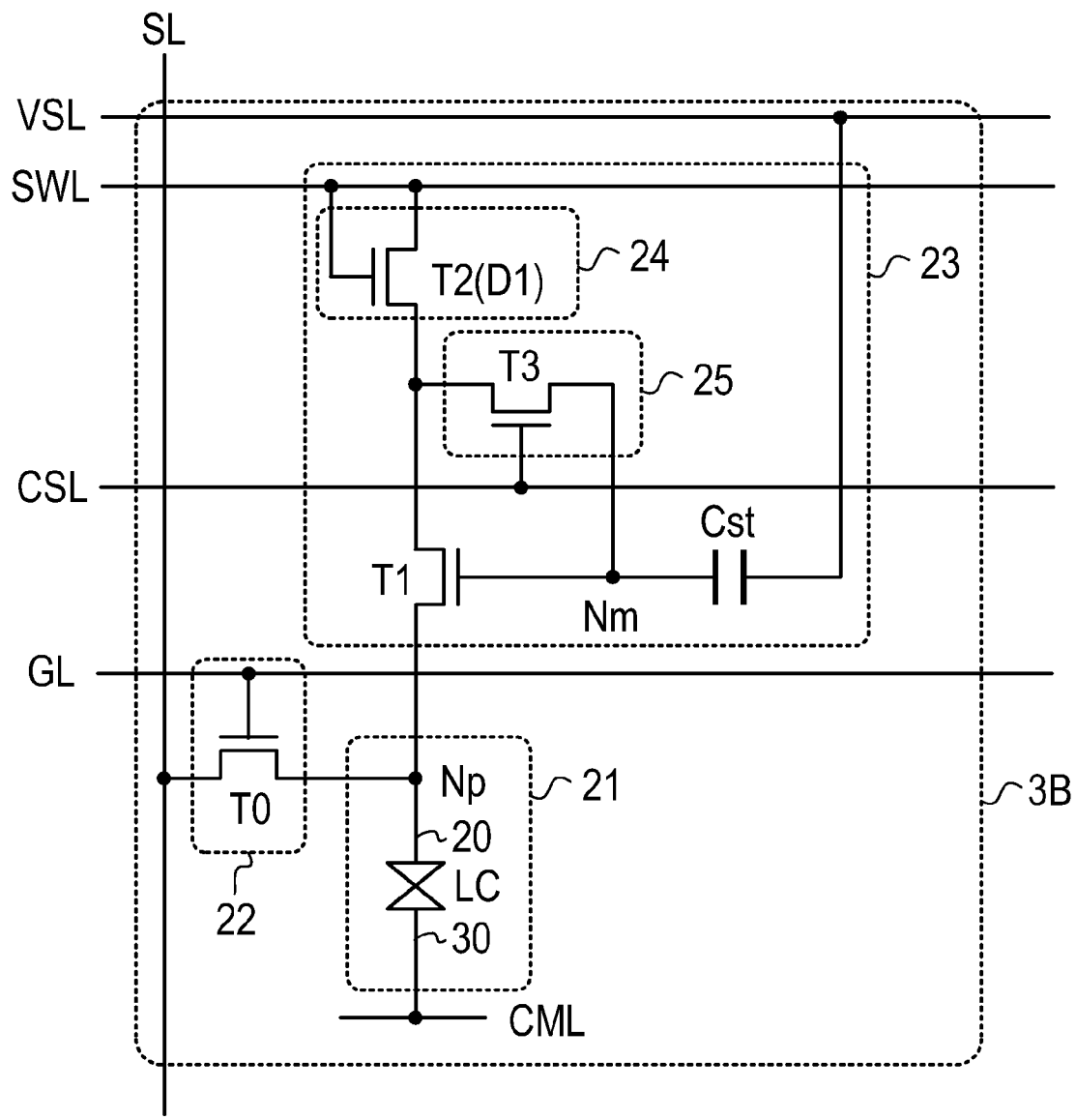
FIG. 5 is a circuit diagram showing one circuit configuration example (type B) of the pixel circuit in the present invention.

FIG. 5 shows a basic circuit configuration of the pixel circuit 3B having the type B. Similar to the pixel circuit 3A, the pixel circuit 3B is configured with the display element unit 21, the first switch circuit 22, and the memory circuit 23. The pixel circuit 3B differs from the pixel circuit 3A with regard to a circuit configuration of the second switch circuit 24 in the memory circuit 23. The pixel circuit 3B slightly differs from the pixel circuit 3A in that its second switch circuit 24 controls a conducting state between the drain electrode of the thin film transistor T1 and the first control signal line SWL, based on the signal level of the first control signal line SWL, but as will be described below, a function of the second switch circuit 24 in the conducting state is substantially the same as that of the pixel circuit 3A. As for the pixel circuit 3A, the second switch circuit 24 is composed of the thin film transistor T2 serving as a three-terminal element in which the drain, the source, and the gate electrodes are independent from each other, while as for the pixel circuit 3B, the second switch circuit 24 is composed of a diode D1 serving as a two-terminal element. In the present embodiment, an anode and a cathode of the diode D1 are connected to the first control signal line SWL and the drain electrode of the thin film transistor T1, respectively. The diode D1 may take various shapes such as a p-n junction diode using p-n junction of the semiconductor forming the thin film transistors T0, T1, and T3, a pin diode using a pin structure of the above semiconductor, and a diode circuit in which the drain electrode and the gate electrode of the thin film transistor T2 are connected to each other.

Except that the pixel circuit 3B differs from the pixel circuit 3A with regard to the circuit configuration of the second switch circuit 24, the two pixel circuit 3A and pixel circuit 3B are the same, so that a duplicative description for the constituent components except for the second switch circuit 24 is omitted.

<<Pixel Circuit Having Type C>>

Figure 6:
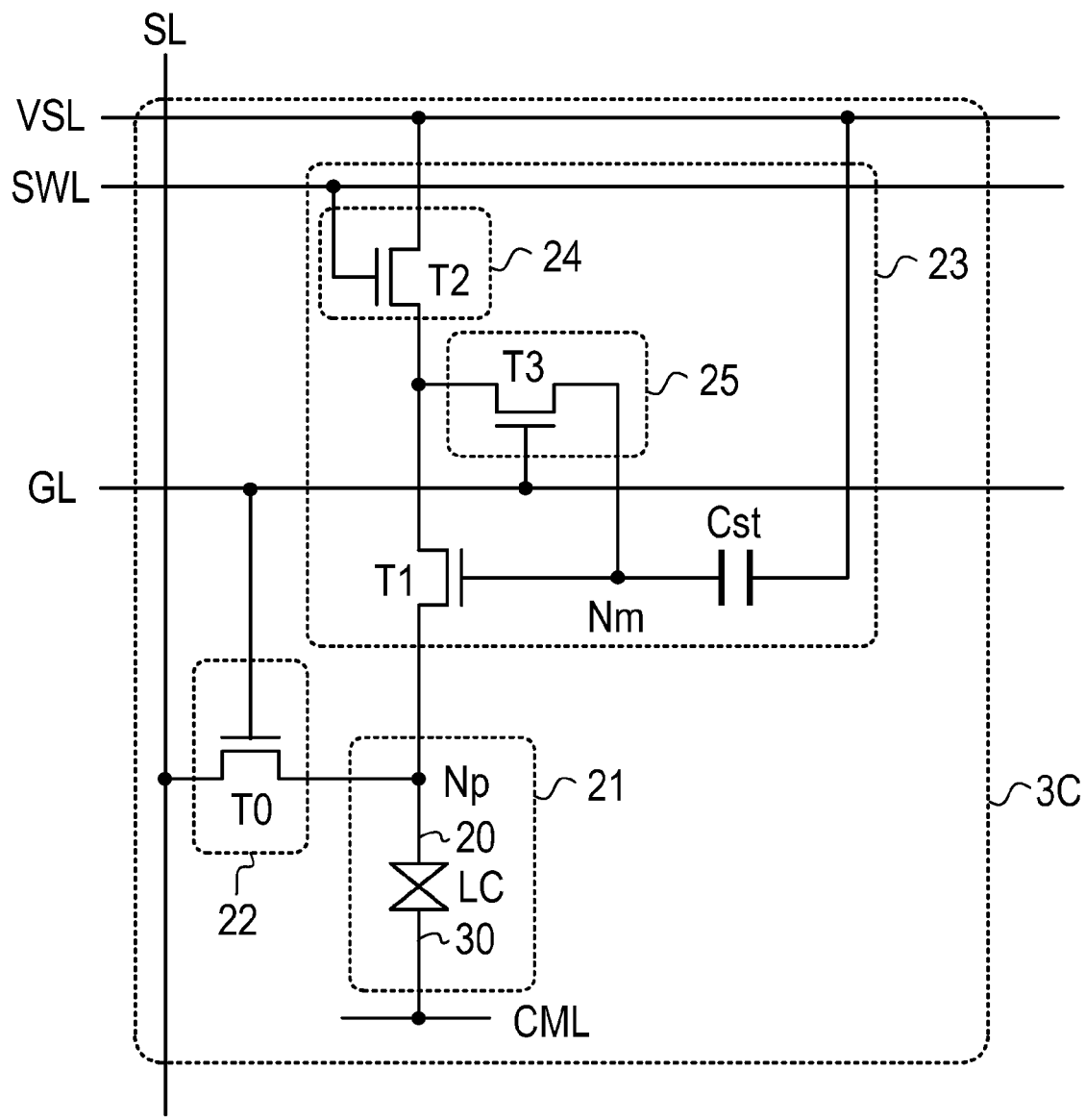
FIG. 6 is a circuit diagram showing one circuit configuration example (type C) of the pixel circuit in the present invention.

FIG. 6 shows a basic circuit configuration of the pixel circuit 3C having the type C. Similar to the pixel circuits 3A and 3B, the pixel circuit 3C is configured with the display element unit 21, the first switch circuit 22, and the memory circuit 23. The pixel circuit 3C differs from the pixel circuit 3A with regard to a signal line connected to the gate electrode of the thin film transistor T3 constituting the third switch circuit 25 in the memory circuit 23. As for the pixel circuit 3A, the gate electrode of the thin film transistor T3 is connected to the second control signal line CSL, while as for the pixel circuit 3C, the gate electrode of the thin film transistor T3 is connected to the gate line GL together with the gate electrode of the thin film transistor T0, and conducting/non-conducting (on/off) of the thin film transistor T0 and the thin film transistor T3 are controlled by the signal level of the gate line GL at the same time.

Except that the pixel circuit 3C differs from the pixel circuit 3A with regard to the signal line connected to the gate electrode of the thin film transistor T3, the two pixel circuit 3A and pixel circuit 3C are the same, so that a duplicative description for the constituent components except for the gate electrode of the thin film transistor T3 is omitted.

<<Pixel Circuit Having Type D>>

Figure 7:
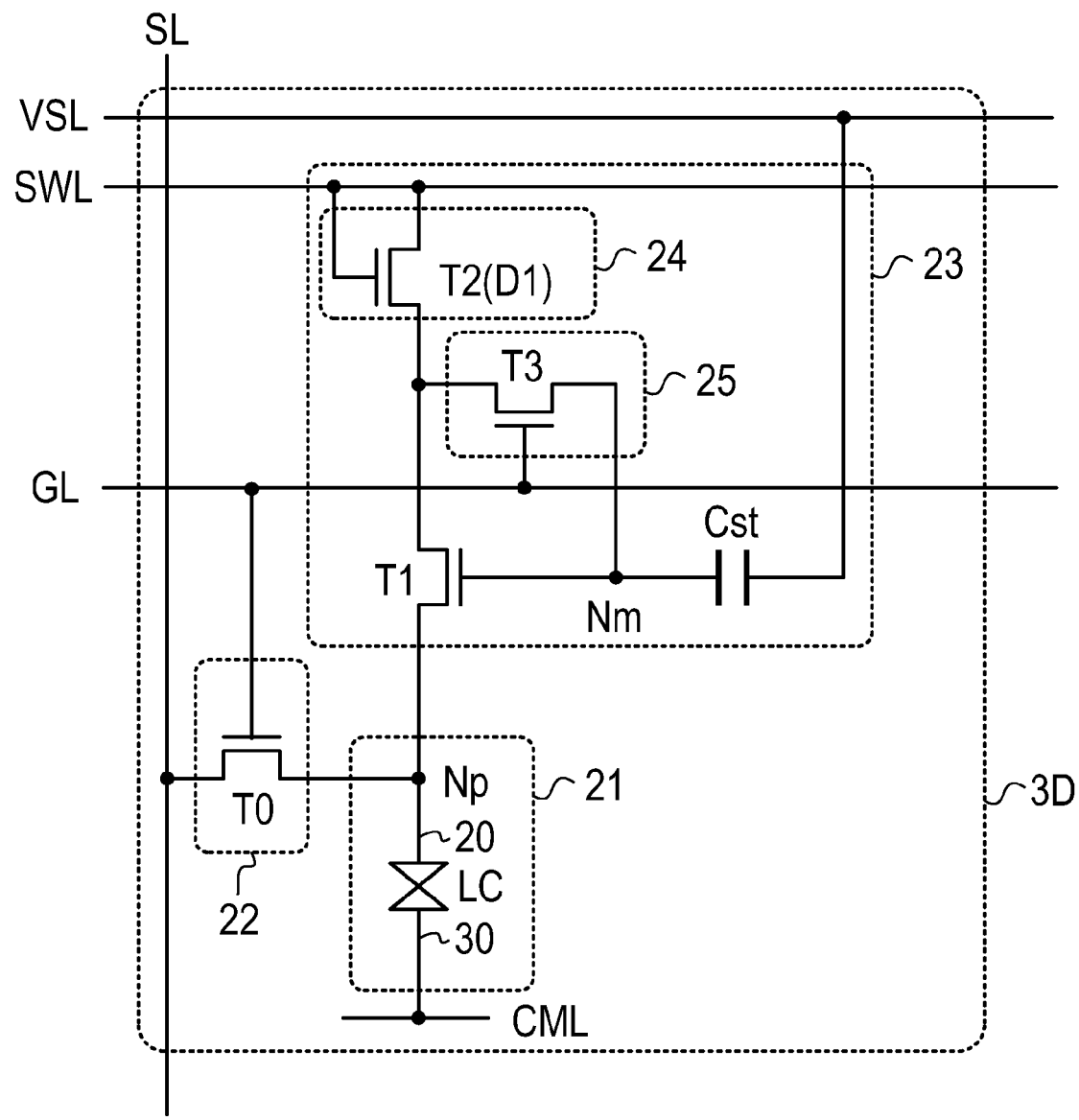
FIG. 7 is a circuit diagram showing one circuit configuration example (type D) of the pixel circuit in the present invention.

FIG. 7 shows a basic circuit configuration of the pixel circuit 3D having the type D. Similar to the pixel circuits 3A to 3C, the pixel circuit 3D is configured with the display element unit 21, the first switch circuit 22, and the memory circuit 23. The pixel circuit 3D differs from the pixel circuit 3A with regard to the circuit configuration of the second switch circuit 24 in the memory circuit 23, and the signal line connected to the gate electrode of the thin film transistor T3 constituting the third switch circuit 25 in the memory circuit 23. That is, the pixel circuit 3D differs from the pixel circuit 3A with regard to both of the different point between the pixel circuit 3B and the pixel circuit 3A and the different point between the pixel circuit 3C and the pixel circuit 3A. Those different points have been already described in the sections of the pixel circuit 3B and the pixel circuit 3C, and the two pixel circuits 3A and 3D are the same except for the above two different points, so that a duplicative description is omitted.

Hereinafter, the memory operation, the restore operation, and the reset operation for the pixel circuits 3A and the pixel circuit 3B in the display device 1 will be described in detail, based on the circuit configurations shown in FIGS. 4 and 5 in the second embodiment. In addition, the memory operation, and the restore operation for the pixel circuits 3C and the pixel circuit 3D in the display device 2 will be described in detail, based on the circuit configuration shown in FIGS. 6 and 7 in the third embodiment. In addition, it has been described above that the source line SL, the gate line GL, the second control signal line CSL, the first control signal line SWL, and the voltage supply line VSL used in each operation are driven by the source driver 13, the gate driver 14, the second gate driver 15, and the display control circuit 11 corresponding to the above lines, so that a description about which driver drives each of the above lines is occasionally omitted in the second and third embodiments.

Before the descriptions in the second and third embodiments, schematic operation contents of each operation will be collectively and briefly described below.

The memory operation is an operation which is executed by the row (by the gate line) in such a manner that when the pixel data voltage Vpd supplied from the source line SL is written in the pixel node Np, the hold voltage Vhd is stored in the storage node Nm in the memory circuit 23 at the same time. Therefore, when the memory operation is performed, a conventional writing operation is executed at the same time. The memory operation is executed for all of the pixel circuits 3 by the row (by the gate line), by repeating the operations the same number of times as the number of the gate lines (row number) while sequentially changing the row serving as a memory operation target.

The restore operation is an operation which restores the voltage state of the pixel node Np to the pixel data voltage Vpd provided when the hold voltage Vhd is stored in the storage node Nm, and is collectively performed for all of the pixel circuits 3. Therefore, when the restore operation is performed, even in the case where the pixel data voltage Vpd held in the pixel node Np has fluctuated due to a leak current of the thin film transistor T0 or the like, or even in the case where the pixel circuit array of each of the display devices 1 and 2 has been set to a non-display state by setting a voltage difference between the pixel node Np of each pixel circuit 3 and the opposed electrode 30 at 0 V, the initial display state of the still image can be restored. That is, it is not necessary to provide a frame memory to store the pixel data of the still image for one frame to be restored, outside the display devices 1 and 2.

The reset operation is an operation which resets the pixel data voltage Vpd held in the pixel node Np by the memory operation or the writing operation, to a predetermined reset voltage Vrst, for all of the pixel circuits 3, in the display device 1 including the pixel circuit 3 having the type A or type B. In the present embodiment, it is assumed that 4 V which is the same voltage as the opposed voltage Vcom is set as the reset voltage Vrst. Therefore, after the reset operation, a liquid crystal voltage Vlc applied between the opposed electrode 30 and the pixel electrode 20 in the unit liquid crystal display element LC in each pixel circuit 3 is 0 V, so that a non-biased state is provided.

Second Embodiment

In the second embodiment, a description will be given to the memory operation, the restore operation, and the reset operation for the pixel circuits 3 having the type A and type B, in the constant display mode, with reference to the drawings. In addition, as described above, the pixel circuits 3 having the type A and the type B only differ from each other in that the second switch circuit 24 includes the thin film transistor T2 serving as the three-terminal element, or includes the diode D1 serving as the two-terminal element, and each of them functions as the switch circuit similarly, so that each operation for the two pixel circuits 3 is basically the same. In the following description, the two pixel circuits 3 are regarded as the same pixel circuit, and the operation part in common will be described, and the different point between the type A and the type B will be described individually.

In addition, in the following description, the fixed voltage to be applied to the voltage supply line VSL is the first initialization voltage (11 V) commonly in each operation in the pixel circuit 3A having the type A, while it is not limited to the first initialization voltage (11 V) and may be the ground voltage (0 V), for example, in the pixel circuit 3B having the type B. Furthermore, it is assumed that the diode D1 of the pixel circuit 3B having the type B is composed of the diode circuit in which the drain electrode and the gate electrode of the thin film transistor T2 are connected to each other, and a turn-on voltage of the diode D1 is 2 V.

<<Memory Operation>>

Figure 8:
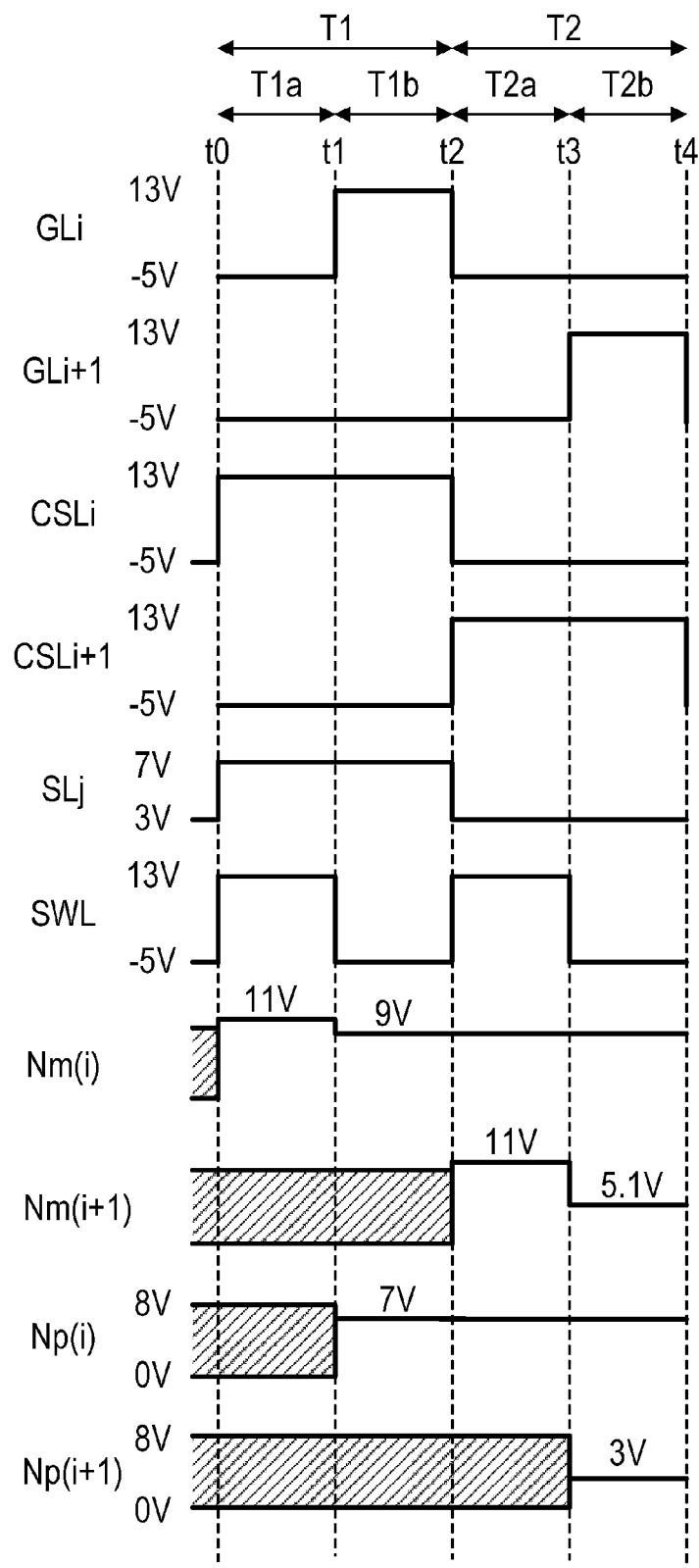
FIG. 8 is a timing chart showing an operation procedure of a memory operation for the pixel circuits having the type A and the type B.

FIG. 8 shows voltage waveforms of signal voltages or node voltages, of two gate lines GLi and GLi+1, a source line SLj, the first control signal line SWL, two second control signal lines CSLi and CSLi+1, pixel nodes Np (i, j) and Np (i+1, j) of two pixel circuits 3 (i, j) and 3 (i+1, j), and storage nodes Nm (i, j) and Nm (i+1, j) of the two pixel circuits 3 (i, j) and 3 (i+1, j), in the case where the memory operation is performed for the two pixel circuits 3 (i, j), 3 (i+1, j) in two certain sequential rows (ith, (i+1)th) in a certain column (jth) among the pixel circuits 3 in the pixel circuit array. Hereinafter, for convenience of explanation, it is assumed that a threshold voltage Vt1 (i, j) of the thin film transistor T1 of the pixel circuit 3 (i, j) is 2 V which is the same as a standard threshold voltage Vt1 (=2V), and a threshold voltage Vt1 (i+1, j) of the thin film transistor T1 of the pixel circuit 3 (i+1, j) is 2.1 V which is higher than the standard threshold voltage Vt1 (=2V) by 0.1 V, and it is assumed that there is a variation of 0.1 V in the threshold voltage of the thin film transistor T1 between the two pixel circuits 3 (i, j) and 3 (i+1, j).

In FIG. 8, a period T1 between times t0 to t2 corresponds to the memory operation period for the pixel circuit 3 (i, j), and a period T2 between times t2 to t4 corresponds to the memory operation period for the pixel circuit 3 (i+1, j). A period T1a between times t0 to t1 corresponds to a preprocessing period of the memory operation period T1, and a period T2a between times t2 to t3 corresponds to a preprocessing period of the memory operation period T2. A period T1b between times t1 to t2 corresponds to a real processing period of the memory operation period T1, and a period T2b between times t3 to t4 corresponds to a real processing period of the memory operation period T2.

In the example shown in FIG. 8, the pixel data voltage Vpd within a voltage range of 0 V to 8 V (hereinafter, referred to as the "normal source line voltage range") is applied to the source line SLj. In the present embodiment, since the opposed voltage Vcom to be fixedly applied to the opposed electrode 30 is 4 V, the liquid crystal voltage Vlc to be applied to the unit liquid crystal display element LC is applied as a difference voltage (Vpd−Vcom) between the pixel data voltage Vpd and the opposed voltage Vcom, so that a polarity of the liquid crystal voltage Vlc is reversed according to whether the pixel data voltage Vpd is higher or lower than 4 V. According to the present embodiment, the pixel data voltage Vpd is controlled such that the polarity is reversed with respect to each one frame period for the same row, and the polarity is reversed between the adjacent rows in the same frame period. In addition, although it is not shown, the polarity of the liquid crystal voltage Vlc is reversed between the adjacent columns in the same row. In addition, a gradation voltage having a discrete value of the pixel data voltage Vpd is determined based on transmittance characteristics of the liquid crystal layer 33 with respect to the liquid crystal voltage Vlc.

In the memory operation period T1, a control selected row voltage (13 V) is applied to the second control signal line CSLi, in order to select the memory circuit 23 of the pixel circuit 3 (i, j), and a control unselected row voltage (−5 V) is applied to the second control signal line CSLi+1 in order not to select the memory circuit 23 of the pixel circuit 3 (i+1, j). Meanwhile, in the memory operation period T2, the control unselected row voltage (−5 V) is applied to the second control signal line CSLi, in order not to select the memory circuit 23 of the pixel circuit 3 (i, j), and the control selected row voltage (13 V) is applied to the second control signal line CSLi+1 in order to select the memory circuit 23 of the pixel circuit 3 (i+1, j). In the memory circuit 23 in the selected pixel circuit 3A, the thin film transistor T3 is turned on, while in the memory circuit 23 in the unselected pixel circuit 3A, the thin film transistor T3 is turned off.

In each of the preprocessing periods T1a and T2a just after starting the memory operation periods T1 and T2, respectively, a first initialization control voltage (13 V) is applied to the first control signal lines SWL in all of the rows at the same time. Consequently, as for the pixel circuit 3A having the type A, the thin film transistor T2 is turned on, and in the pixel circuit 3 in the selected row to which the control selected row voltage (13 V) has been applied, the thin film transistor T2 and the thin film transistor T3 are turned on at the same time, so that the voltage supply line VSL is conducted with the storage node Nm, and the first initialization voltage (11 V) applied to the voltage supply line VSL is supplied to the storage node Nm. Meanwhile, as for the pixel circuit 3B having the type B, the diode D1 is in a forward-biased state and is turned on, and in the pixel circuit 3 in the selected row to which the control selected row voltage (13 V) has been applied, a current path is formed from the first control signal line SWL to the storage node Nm through the diode D1 and the thin film transistor T3, and the first initialization voltage (11 V) which is reduced from the first initialization control voltage (13 V) by the turn-on voltage (2 V) of the diode D1 is supplied to the storage node Nm.

Then, in each of the real processing periods T1b and T2b of the memory operation periods T1 and T2, respectively, a writing control voltage (−5 V) lower than the normal source line voltage range (0 V to 8 V) is applied to the first control signal lines SWL in all of the rows at the same time. As a result, as for the pixel circuit 3A having the type A, the thin film transistor T2 is turned off, and the conduction between the voltage supply line VSL and the storage node Nm is cut off, while as for the pixel circuit 3B having the type B, the diode D1 is in reversely-biased state, and the current path from the first control signal line SWL to the storage node Nm is cut off. Thus, in the pixel circuit 3 in each selected row, the thin film transistor T1 serves as a diode in which the drain electrode and the gate electrode are short-circuited by the thin film transistor T3. As a result, a current path is formed from the storage node Nm to the pixel node Np through the thin film transistor T1.

Furthermore, in the real processing period T1b, a scan selected row voltage (13 V) is applied to the gate line GLi, in order to select the pixel circuit 3 (i, j), while a scan unselected row voltage (−5 V) is applied to the gate line GLi+1, in order not to select the pixel circuit 3 (i+1, j). Meanwhile, in the real processing period T2b, the scan unselected row voltage (−5 V) is applied to the gate line GLi, in order not to select the pixel circuit 3 (i, j), while the scan selected row voltage (13 V) is applied to the gate line GLi+1, in order to select the pixel circuit 3 (i+1, j). In the selected pixel circuit 3, the thin film transistor T0 is turned on, and in the unselected pixel circuit 3, the thin film transistor T0 is turned off. As a result, in the real processing periods T1b and T2b, the pixel data voltage Vpd corresponding to the pixel data is applied from the source line SLj to the pixel node Np of the selected pixel circuit 3. According to the example shown in FIG. 8, in the real processing period T1b, Vpd=7 V is applied to the pixel node Np (i, j) of the pixel circuit 3 (i, j), while in the real processing period T2b, Vpd=3 V is applied to the pixel node Np (i+1, j) of the pixel circuit 3 (i+1, j). As a result, in the real processing period T1b, the hold voltage Vhd of the storage node Nm (i, j) of the pixel circuit 3 (i, j) decreases from 11 V to 9 V which is higher than the pixel data voltage Vpd (=7 V) by the threshold voltage Vt1 (i, j) (=2 V), while in the real processing period T2b, the hold voltage Vhd of the storage node Nm (i+1, j) of the pixel circuit 3A (i+1, j) decreases from 11 V to 5.1 V which is higher than the pixel data voltage Vpd (=3 V) by the threshold voltage Vt1 (i+1, j) (=2.1 V). Thus, in the decreased voltage state in each period, the thin film transistor T1 in the diode state is cut off, so that the voltage state of the storage node Nm is held in the capacitor element Cst of each pixel circuit 3.

In the pixel circuit 3 (i, j), after the completion of the real processing period T1b, the voltage applied to the gate line GLi shifts from the scan selected row voltage (13 V) to the scan unselected row voltage (−5 V), and the voltage applied to the second control signal line CSLi shifts from the control selected row voltage (13 V) to the control unselected row voltage (−5 V), so that the thin film transistor T0 and the thin film transistor T3 are both turned off, and as a result, the pixel node Np (i, j) is electrically separated from the source line SLj and the storage node Nm (i, j), and the storage node Nm (i, j) is also electrically separated from the pixel node Np (i, j) and is in a floating state. As a result, the pixel data voltage Vpd (=7 V) is held in the pixel node Np (i, j), and the hold voltage Vhd (=9 V) is continuously stored in the storage node Nm (i, j).

In the pixel circuit 3 (i+1, j), after the completion of the real processing period T2b, the voltage applied to the gate line GLi+1 shifts from the scan selected row voltage (13 V) to the scan unselected row voltage (−5 V), and the voltage applied to the second control signal line CSLi+1 shifts from the control selected row voltage (13 V) to the control unselected row voltage (−5 V), so that the thin film transistor T0 and the thin film transistor T3 are both turned off, and as a result, the pixel node Np (i+1, j) is electrically separated from the source line SLj and the storage node Nm (i+1, j), and the storage node Nm (i+1, j) is also electrically separated from the pixel node Np (i+1, j) and is in a floating state. As a result, the pixel data voltage Vpd (=3 V) is held in the pixel node Np (i+1, j), and the hold voltage Vhd (=5.1 V) is continuously stored in the storage node Nm (i+1, j).

<<Restore Operation>>

Figure 9:
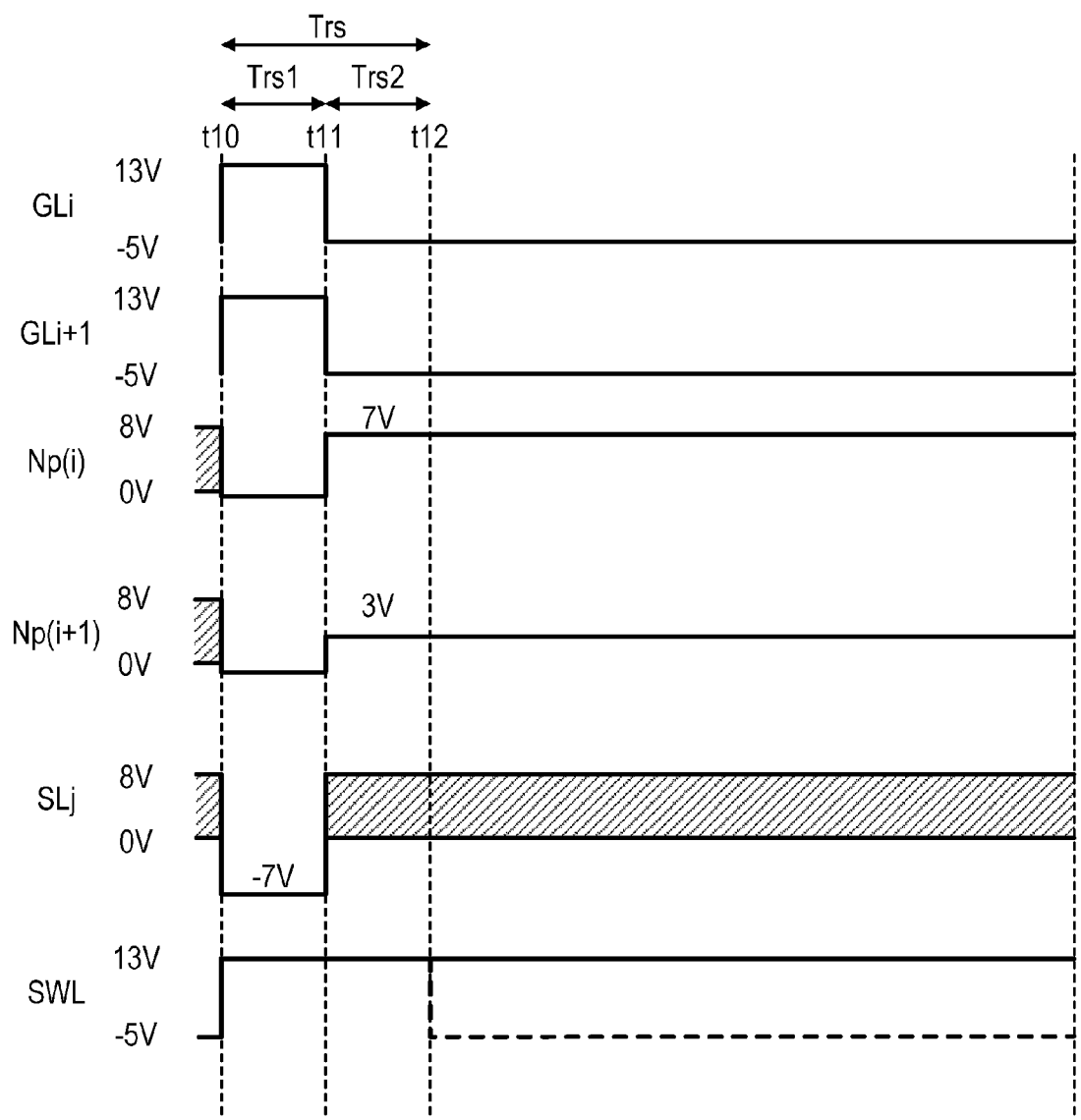
FIG. 9 is a timing chart showing one example of an operation procedure of a restore operation for the pixel circuits having the type A and the type B.

FIG. 9 shows voltage waveforms of signal voltages or node voltages of the gate lines GLi and GLi+1, the signal line SLj, the first control signal line SWL, and each of the pixel node Np (i+j) and Np (i+1, j) of the two pixel circuits 3 (i, j) and 3 (i+1, j), in the case where the restore operation is performed for the two pixel circuits 3 (i, j) and 3 (i+1, j) in which the above memory operation has been performed. In addition, during a restore operation period Trs (times t10 to t12), the control unselected row voltage (−5 V) is applied to all of the second control signal lines CSL, and the thin film transistors T3 in all of the pixel circuits 3 are in the off state. That is, the storage node Nm of each pixel circuit 3 is kept in the electrically separated floating state.

In addition, in the following description, it is assumed that after the above memory operation and before the start of the restore operation, the node voltage of each of the pixel nodes Np (i, j) and Np (i+1, j) has fluctuated due to the leak current of the thin film transistor T0 and the like, or new pixel data has been written, or the voltage has shifted to the non-biased state due to the reset operation which will be described below.

During the restore operation period Trs for the times t10 to t12 shown in FIG. 9, the restore operation is executed for the two pixel circuits 3 (i, j) and 3 (i+1, j) at the same time. A period Trs1 for times t10 to t11 corresponds to a preprocessing period of the restore operation period Trs. A period Trs2 for times t11 to t12 corresponds to a real processing period of the restore operation period Trs.

At a starting point (time t10) of the preprocessing period Trs1 or prior to it, a restore control voltage (13 V) is applied to the first control signal lines SWL in all of the rows at the same time, and in addition, at the starting point (time t10) of the preprocessing period Trs1, the scan selected row voltage (13 V) is applied to the gate lines GLi, and GLi+1, and a second initialization control voltage (−7 V) is applied to the source line SLj. As a result, the thin film transistor T0 is turned on, and the voltages of the pixel nodes Np (i, j) and Np (i+1, j) decrease toward the second initialization control voltage (−7 V) at the same time. However, as for the pixel circuit 3A having the type A, since the thin film transistor T2 is in the on state, the current path is formed from the voltage supply line VSL to each of the pixel nodes Np (i, j) and Np (i+1, j) at the same time, while as for the pixel circuit 3B having the type B, since the diode D1 is in the forward-biased state and is turned on, the current path is formed from the first control signal line SWL to each of the pixel nodes Np (i, j) and Np (i+1, j) at the same time. As a result, the pixel circuits 3 having the type A and the type B are both eventually initialized to voltages (intermediate voltage) between the second initialization control voltage (−7 V), and the pixel data voltages Vpd just after the memory operation, which are obtained by subtracting the threshold voltages Vt1 (i, j) and Vt1 (i+1, j) of the corresponding thin film transistors T1 from the hold voltages Vhd stored in the corresponding storage nodes Nm (i, j) and Nm (i+1, j), respectively. More specifically, the voltage of the pixel node Np (i, j) is initialized to the voltage (intermediate voltage) between the pixel data voltage Vpd (=7 V) just after the memory operation and the second initialization control voltage (−7 V), and the voltage of the pixel node Np (i+1, j) is initialized to the voltage (intermediate voltage) between the pixel data voltage Vpd (=3 V) just after the memory operation and the second initialization control voltage (−7 V). In addition, the intermediate voltage is automatically adjusted so that current values flowing in each of the thin film transistors T0, T1, and T2 show the same value in the case of the pixel circuit 3A having the type A, while the intermediate voltage is automatically adjusted so that current values flowing in the thin film transistors T0 and T1 and the diode D1 show the same value. Here, the second initialization control voltage (−7 V) is set so as to satisfy following two conditions. As the first condition, the intermediate voltage (voltage of the pixel node Np after the initialization) needs to be lower than a minimum value (0 V) in the voltage range (0 V to 8 V) that the pixel data voltage Vpd can take just after the memory operation. As the second condition, the thin film transistor T3 needs to be kept in the off state. More specifically, the voltage of the drain electrode of the thin film transistor T1 (source electrode of the thin film transistor T2) needs to fall within the voltage range (that is, higher than −7 V) in which the thin film transistor T3 is kept in the off state under the condition that the control unselected row voltage (−5 V) is applied to the second control signal line CSL. In addition, the second initialization control voltage is not limited to −7 V as long as the two conditions are satisfied. Furthermore, the scan selected row voltage (13 V) in the restore operation only has to be a voltage value in which the thin film transistor T0 is turned on, and the above two conditions are satisfied under the condition that the second initialization control voltage (−7 V) is applied to the source line SLj, so that the scan selected row voltage is not always limited to 13 V and may be a voltage lower than 13 V (such as 0 V).

Subsequently, in the real processing period Trs2, when the voltage of the source line SLj is returned into the normal source line voltage range, and the scan unselected row voltage (−5 V) is applied to the gate lines GLi and GLi+1, the thin film transistor T0 in the on state is turned off, and each of the voltages of the pixel nodes Np (i, j) and Np (i+1, j) is charged from the initialized voltage level to the pixel data voltage Vpd just after the memory operation by which the thin film transistor T1 is turned off, with a charging current from the voltage supply line VSL toward each of the pixel nodes Np (i, j) and Np (i+1, j) in the case of the pixel circuit 3A having the type A, or with a charging current from the first control signal line SWL to each of the pixel nodes Np (i, j) and Np (i+1, j) through the diodes D1 in the case of the pixel circuit 3B having the type B. In the memory operation, the hold voltage Vhd higher than the pixel data voltage Vpd of the pixel node Np by the threshold voltage Vth1 of the thin film transistor T1 is stored in the storage node Nm, so that in the restore operation, the voltage state of the pixel node Np can be restored to the pixel data voltage Vpd (7 V, 3 V) just after the memory operation, which is provided by subtracting the threshold voltage Vth1 from the hold voltage Vhd, without being affected by the variation of the threshold voltage Vth1 of the thin film transistor T1 among the pixel circuits 3.

After the real processing period Trs2, as shown in FIG. 9, the signal voltage of the first control signal line SWL may be maintained at the restore control voltage (13 V), or it may shift from the restore control voltage (13 V) to the writing control voltage (−5 V) to turn off the thin film transistor T2.

<<Another Example of Restore Operation>>

Figure 10:
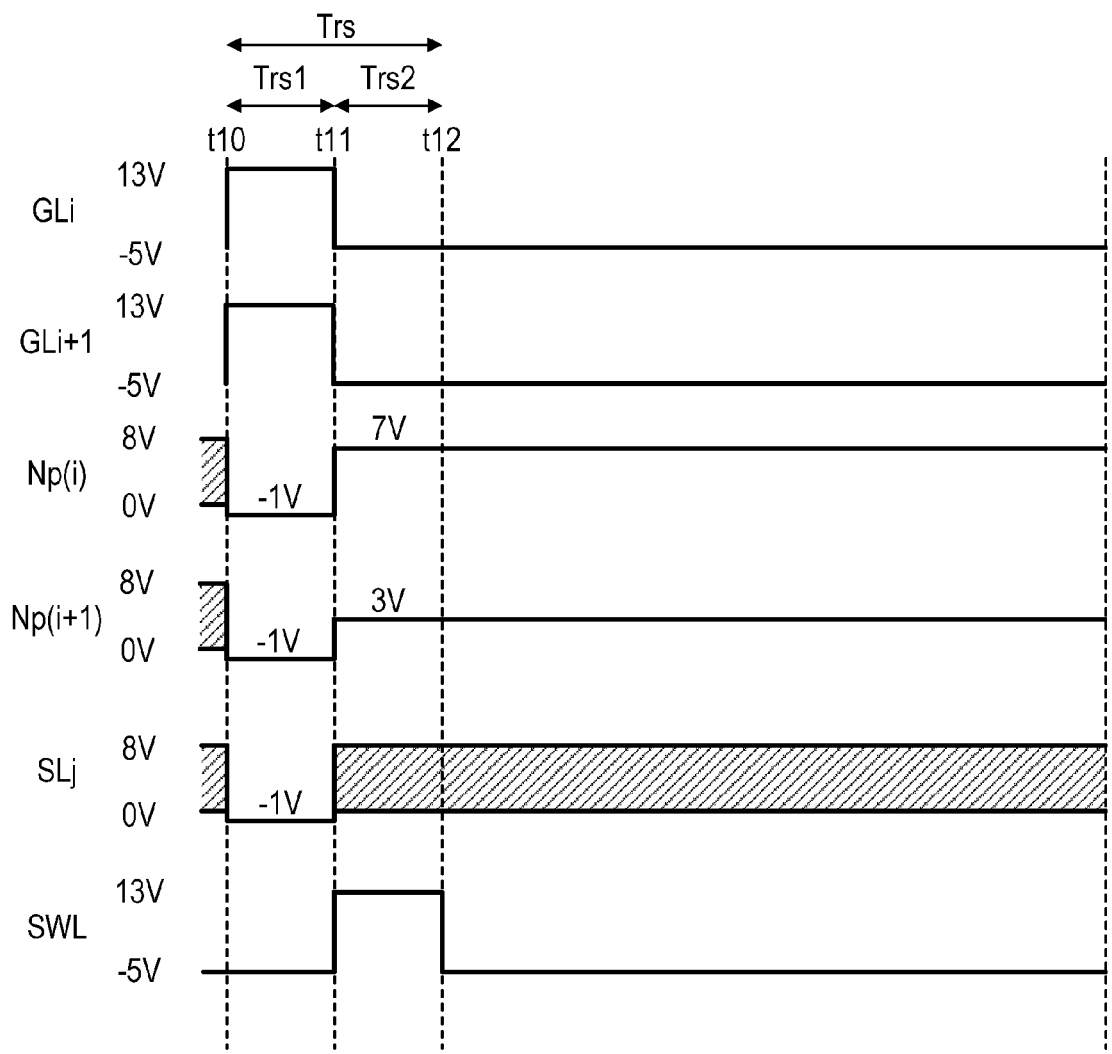
FIG. 10 is a timing chart showing another example of the operation procedure of the restore operation for the pixel circuits having the type A and the type B.

As another example of the restore operation shown in FIG. 9, the second initialization control voltage may be changed from −7 V to a higher voltage of −1 V, and the time to apply the restore control voltage (13 V) to the first control signal lines SWL in all of the rows at the same time may be delayed to the starting point (time t11) of the real processing period Trs2, as shown in FIG. 10. In this case, the current path is not formed from the voltage supply line VSL (pixel circuit 3A having the type A) or the first control signal line SWL (pixel circuit 3B having the type B) to each of the pixel nodes Np (i, j) and Np (i+1, j) in the preprocessing period Trs1, so that each of the pixel nodes Np (i, j) and Np (i+1, j) is initialized to the second initialization control voltage (−1 V). In addition, the hold voltage Vhd stored in each of the storage nodes Nm (i, j) and Nm (i+1, j) is equal to or higher than the threshold voltage Vth1 of the thin film transistor T1, so that the thin film transistor T1 is turned on, and the voltage of the drain electrode also reaches the second initialization control voltage (−1 V). In this case also, the above-described two conditions are satisfied. The operation in the real processing period Trs2 is the same as the example shown in FIG. 9. In addition, FIG. 10 shows a case where the signal voltage of the first control signal line SWL shifts from the restore control voltage (13 V) to the writing control voltage (−5 V) after the completion of the real processing period Trs2.

<<Reset Operation>>

Figure 11:
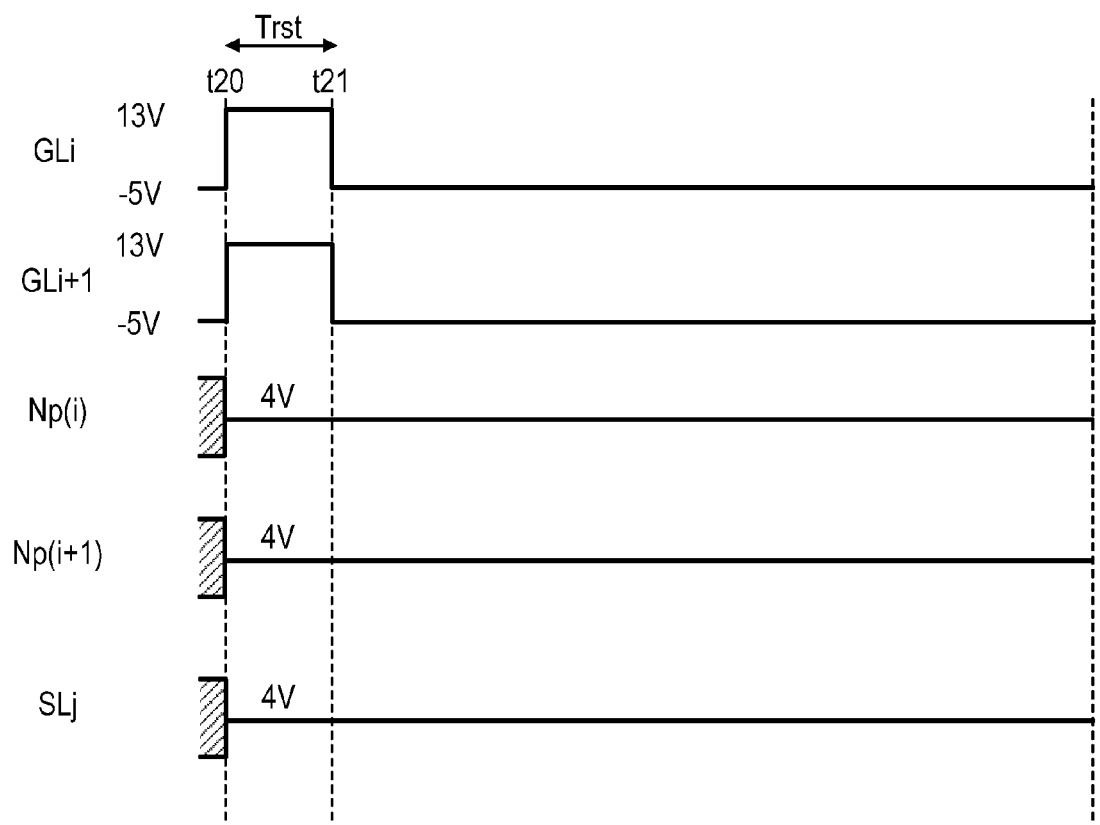
FIG. 11 is a timing chart showing an operation procedure of a reset operation for the pixel circuits having the type A and the type B.

FIG. 11 shows voltage waveforms of the signal voltages or the node voltages of the gate lines GLi, GLi+1, the source line SLj, and the pixel nodes Np (i, j) and Np (i+1, j) of the two pixel circuits 3 (i, j) and 3 (i+1, j) in the case where the reset operation is performed for the two pixel circuits 3 (i, j) and 3 (i+1, j) at the same time. In addition, during a reset operation period Trst (times t20 to t21), the writing control voltage (−5 V) is applied to the first control signal line SWL, and the control unselected row voltage (−5 V) is applied to all of the second control signal lines CSL, so that in the pixel circuit 3A having the type A, the thin film transistors T2 and the thin film transistors T3 of all of the pixel circuits 3A are turned off, while in the pixel circuit 3B having the type B, the diodes D1 reversely-biased state and the thin film transistors T3 are turned off in all of the pixel circuits 3B. That is, the storage node Nm in each pixel circuit 3 is kept in the electrically separated floating state.

At a starting point (time t20) of the reset operation period Trst, the scan selected row voltage (13 V) is applied to the gate lines GLi and GLi+1, and the reset voltage (4 V) which is the same voltage as the opposed voltage Vcom is applied to the source line SLj. As a result, the voltage of each of the pixel nodes Np (i, j) and Np (i+1, j) is forcedly set to the reset voltage (4 V) through the thin film transistor T0. Here, in the case where the hold voltage Vhd stored in each of the storage nodes Nm (i, j) and Nm (i+1, j) is equal to or higher than 6 V, the thin film transistor T1 is turned on and the voltage of the drain electrode is set to 4 V, but the control unselected row voltage (−5 V) is applied to the second control signal line CSL, so that the off-state of the thin film transistor T3 is maintained, and the hold voltage Vhd stored in each of the storage nodes Nm (i, j) and Nm (i+1, j) is continuously maintained in the above voltage state. After the reset operation period Trst, the scan unselected row voltage (−5 V) is applied to the gate lines GLi and GLi+1, and the thin film transistor T0 is turned off.

In the above reset operation, the liquid crystal voltage VLc across the pixel node Np and the opposed electrode 30 in the pixel circuit 3A reaches 0 V, that is, the unit liquid crystal display element LC is in the non-biased state, and is in the undisplayed state.

After the above reset operation, even when the power supply of the display device 1 is cut off, the charges corresponding to the hold voltage Vhd stored in the storage node Nm are held in the capacitor element Cst. After the power supply has been turned on again, when the restore operation is executed in the above-described manner after the unit liquid crystal display element LC of the pixel circuit 3A has been in undisplayed state once, the displayed state can be restored to the displayed state corresponding to the hold voltage Vhd stored in the memory operation just before the power supply is cut off.

Third Embodiment

In the third embodiment, a description will be given to the memory operation, and the restore operation for the pixel circuits 3 having the type C and type D, in the constant display mode, with reference to the drawings. In addition, as described above, the pixel circuits 3 having the type C and the type D only differ from each other in that the second switch circuit 24 includes the thin film transistor T2 serving as the three-terminal element, or includes the diode D1 serving as the two-terminal element, and each of them functions as the switch circuit similarly, so that each operation of the two pixel circuits 3 is basically the same. In the following description, the two pixel circuits 3 are regarded as the same pixel circuit, and the operation part in common will be described, and the different point between the type C and the type D will be described individually.

The pixel circuits 3 having the type C and the type D differ from the pixel circuits 3 having the type A and the type B in that the gate electrode of the thin film transistor T3 of the third switch circuit 25 is connected to the gate line GL. Therefore, it is to be noted that as for the pixel circuits 3 having the type C and type D, the thin film transistor T0 and the thin film transistor T3 cannot be independently controlled. Since the memory circuit 23 is used in each of the memory operation and the restore operation, the operation condition of the thin film transistor T0 is adjusted while the operation and state of the thin film transistor T3 are conformed to those of the pixel circuits having the type A and the type B, so that the memory operation and the restore operation of the pixel circuits 3 having the type C and the type D can be implemented similarly to the operations of the pixel circuits 3 having the type A and the type B.

In addition, in the following description, the same conditions as those in the pixel circuits 3 having the type A and the type B described in the second embodiment are used for the threshold voltage of the thin film transistor T1, its variation, the voltage range (normal source line voltage range) of the pixel data voltage Vpd applied to the source line SL, and the opposed voltage Vcom to be applied to the opposed electrode 30. Furthermore, similar to the second embodiment, the fixed voltage to be applied to the voltage supply line VSL is the first initialization voltage (11 V) in each operation in the pixel circuit 3C having the type C, but as for the pixel circuit 3D having the type D, it is not limited to the first initialization voltage (11 V) and it may be the ground voltage (0 V), for example. In addition, it is assumed that the diode D1 of the pixel circuit 3D having the type D is composed of the diode circuit in which the drain electrode and the gate electrode of the thin film transistor T2 are connected to each other, and a turn-on voltage of the diode D1 is 2 V.

<<Memory Operation>>

Figure 12:
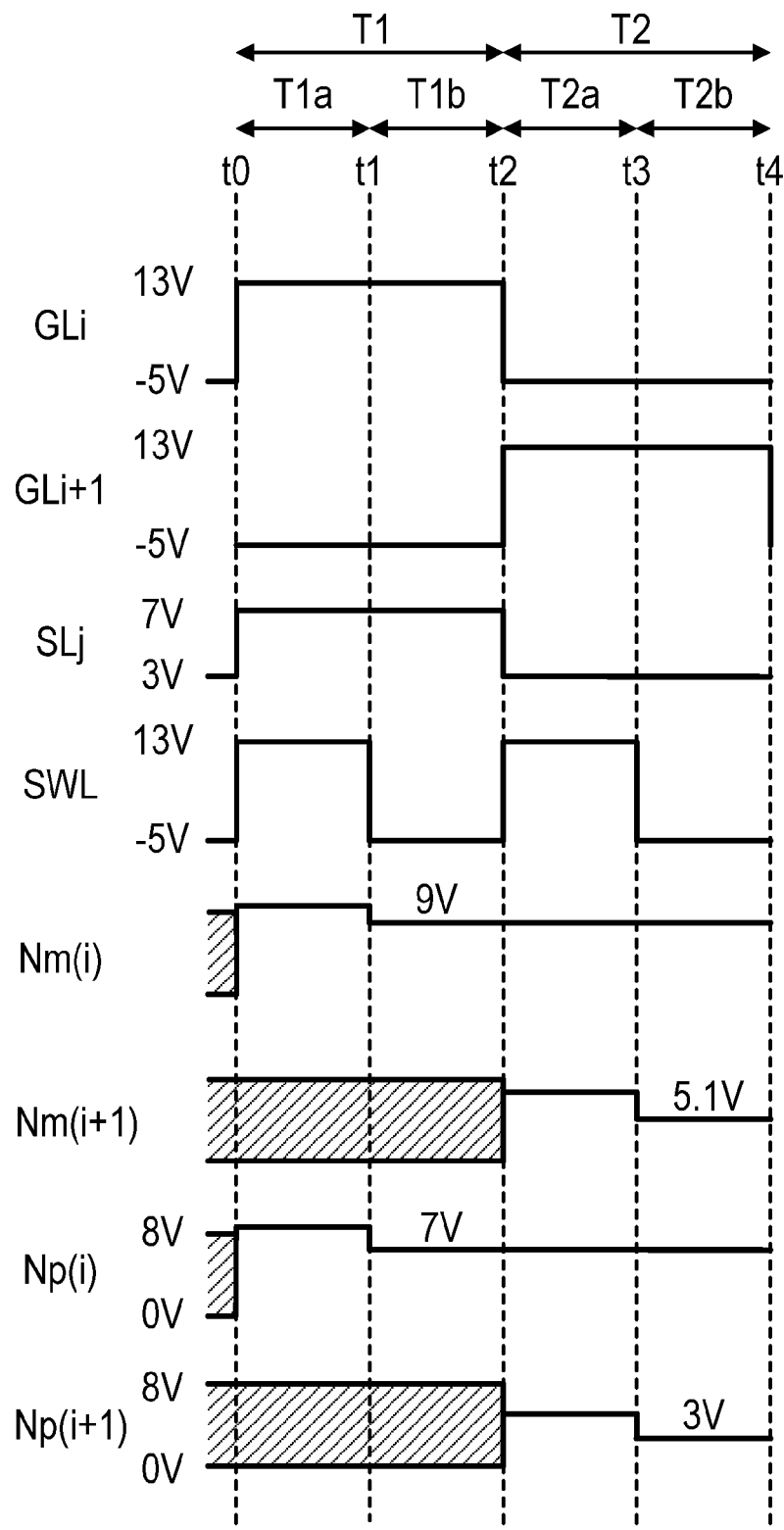
FIG. 12 is a timing chart showing an operation procedure of a memory operation for the pixel circuits having the type C and the type D.

FIG. 12 shows voltage waveforms of signal voltages or node voltages of the two gate lines GLi and GLi+1, the source line SLj, the first control signal line SWL, the pixel nodes Np (i, j) and Np (i+1,j) of the two pixel circuits 3 (i, j) and 3 (i+1, j), and the storage nodes Nm (i, j) and Nm (i+1, j) of the two pixel circuits 3 (i, j) and 3 (i+1, j), in the case where the memory operation is performed for the two pixel circuits 3 (i, j), 3 (i+1, j) in the two sequential rows (ith, (i+1)th) in the column (jth) among the pixel circuits 3 in the pixel circuit array.

A relationship between the memory operation periods T1 and T2, the preprocessing periods T1a and T2a, and the real processing periods T1b and T2b, and the times t0 to t4 shown in FIG. 12 is the same as described in the second embodiment, so that a duplicative description will be omitted.

During the memory operation period T1, a selected row voltage (13 V) is applied to the gate line GLi in order to select the pixel circuit 3 (i, j), and an unselected row voltage (−5 V) is applied to the gate line GLi+1 in order not to select the pixel circuit 3 (i+1, j). Meanwhile, during the memory operation period T2, the unselected row voltage (−5 V) is applied to the gate line GLi in order not to select the pixel circuit 3 (i, j), and the selected row voltage (13 V) is applied to the gate line GLi+1 in order to select the pixel circuit 3 (i+1, j). In the selected pixel circuit 3, the thin film transistor T0 and the thin film transistor T3 are turned on, while in the unselected pixel circuit 3, the thin film transistor T0 and the thin film transistor T3 are turned off.

In each of the preprocessing periods T1a and T2a just after starting the memory operation periods T1 and T2, respectively, the first initialization control voltage (13 V) is applied to the first control signal lines SWL in all of the rows at the same time. Consequently, as for the pixel circuit 3C having the type C, the thin film transistor T2 is turned on, and in the pixel circuit 3 in the selected row to which the selected row voltage (13 V) has been applied, the thin film transistor T2 and the thin film transistor T3 are turned on at the same time, so that the voltage supply line VSL is connected to the storage node Nm, and the storage node Nm is charged toward the first initialization voltage (11 V) applied to the voltage supply line VSL. Meanwhile, as for the pixel circuit 3D having the type D, the diode D1 becomes a forward-biased state and is turned on, and in the pixel circuit 3 in the selected row to which the selected row voltage (13 V) has been applied, a current path is formed from the first control signal line SWL to the storage node Nm through the diode D1 and the thin film transistor T3, and the storage node Nm is charged toward the first initialization voltage (11 V) which is reduced from the first initialization control voltage (13 V) by the turn-on voltage (2 V) of the diode D1.

Meanwhile, the pixel node Np and the source line SLj are connected through the thin film transistor T0, so that the pixel data voltage Vpd corresponding to the pixel data is applied from the source line SLj to the pixel node Np. In the example shown in FIG. 12, as one example, during the real processing period T1b, Vpd=7 V is applied to the pixel node Np (i, j) of the pixel circuit 3 (i, j), while in the real processing period T2b, Vpd=3 V is applied to the pixel node Np (i+1, j) of the pixel circuit 3 (i+1, j).

The storage node Nm is charged toward the first initialization voltage (11 V), and the transistor T1 is turned on, so that in the pixel circuit 3C having the type C, the current path is formed from the voltage supply line VSL to the source line SLj while in the pixel circuit 3D having the type D, the current path is formed from the first control signal line SWL to the source line SLj. As a result, the voltage of the drain electrode of the transistor T1 reduces from the first initialization voltage (11 V) toward the pixel data voltage Vpd applied to the pixel node Np, and the voltage of the pixel node Np rises from the pixel data voltage Vpd. Since the thin film transistor T3 is in the on state, the voltages of the drain electrode of the transistor T1 and the storage node Nm reach a second initialization voltage intermediate between the first initialization voltage (11 V) and the voltage provided by adding the threshold voltage Vth1 of the transistor T1 to the pixel data voltage Vpd. Therefore, the voltage difference between the storage node Nm and the pixel node Np is initialized so as to be greater than the threshold voltage Vth1 of the transistor T1.

Then, during each of the real processing periods T1b and T2b of the memory operation periods T1 and T2, respectively, the writing control voltage (−5 V) lower than the normal source line voltage range (0 V to 8 V) is applied to the first control signal lines SWL in all of the rows at the same time. As a result, as for the pixel circuit 3C having the type C, the thin film transistor T2 is turned off, and the voltage supply line VSL is separated from the storage node Nm, while as for the pixel circuit 3D having the type D, the diode D1 is in the reversely-biased state, and the current path from the first control signal line SWL until the storage node Nm is cut off. Thus, in the pixel circuit 3 in each selected row, the thin film transistor T1 serves as a diode in which the drain electrode and the gate electrode are short-circuited by the thin film transistor T3. Since the voltage difference between the storage node Nm and the pixel node Np has been initialized so as to be higher than the threshold voltage Vt1 of the transistor T1, the current path is formed from the storage node Nm to the pixel node Np through the thin film transistor T1. In addition, in the pixel node Np, the voltage which has been increased once from the pixel data voltage Vpd supplied from the source line SL during the preprocessing periods T1a and T2a decreases to the pixel data voltage Vpd.

As a result, during the real processing period T1b, the hold voltage Vhd of the storage node Nm (i, j) of the pixel circuit 3 (i, j) decreases from the second initialization voltage to 9 V which is higher than the pixel data voltage Vpd (=7 V) by the threshold voltage Vt1 (i, j) (=2 V), while during the real processing period T2b, the hold voltage Vhd of the storage node Nm (i+1, j) of the pixel circuit 3 (i+1, j) decreases from the second initialization voltage to 5.1 V which is higher than the pixel data voltage Vpd (=3 V) by the threshold voltage Vt1 (i+1, j) (=2.1 V). In the pixel circuit 3, the voltage of the storage node Nm decreases, and the voltage difference between the storage node Nm and the pixel node Np becomes equal to the threshold voltage Vt1 of the thin film transistor T1, so that the thin film transistor T1 in the diode state is cut off, and the voltage state of the storage node Nm is held in the capacitor element Cst of each pixel circuit 3.

In the pixel circuit 3 (i, j), after the completion of the real processing period T1b, the voltage applied to the gate line GLi shifts from the selected row voltage (13 V) to the unselected row voltage (−5 V), and the thin film transistor T0 and the thin film transistor T3 are both turned off, so that the pixel node Np (i, j) is electrically separated from the source line SLj and the storage node Nm (i, j), and the storage node Nm (i, j) is also electrically separated from the pixel node Np (i, j) and is in a floating state. As a result, the pixel data voltage Vpd (=7 V) is held in the pixel node Np (i, j), and the hold voltage Vhd (=9 V) is continuously stored in the storage node Nm (i, j).

In the pixel circuit 3 (i+1, j), after the completion of the real processing period T2b, the voltage applied to the gate line GLi+1 shifts from the selected row voltage (13 V) to the unselected row voltage (−5 V), so that the thin film transistor T0 and the thin film transistor T3 are both turned off, and as a result, the pixel node Np (i+1, j) is electrically separated from the source line SLj and the storage node Nm (i+1, j), and the storage node Nm (i+1, j) is also electrically separated from the pixel node Np (i+1, j) and is in a floating state. As a result, the pixel data voltage Vpd (=3 V) is held in the pixel node Np (i+1, j), and the hold voltage Vhd (=5.1 V) is continuously stored in the storage node Nm (i+1, j).

Here, it is to be noted that the pixel circuits 3 having the type A and the type B differ from the pixel circuits 3 having the type C and the type D only in that the gate electrode of the thin film transistor T3 is connected to the second control signal line CSL instead of the gate line GL, as described above. Therefore, in the pixel circuits 3 having the type A and the type B also, when the control for each of the second control signal lines CSLi, and CSLi+1 is performed similarly to that for each of the gate lines GLi, GLi+1, the same memory operation as the memory operation for the type C and the type D shown in FIG. 12 can be performed.

<<Restore Operation>>

Figure 13:
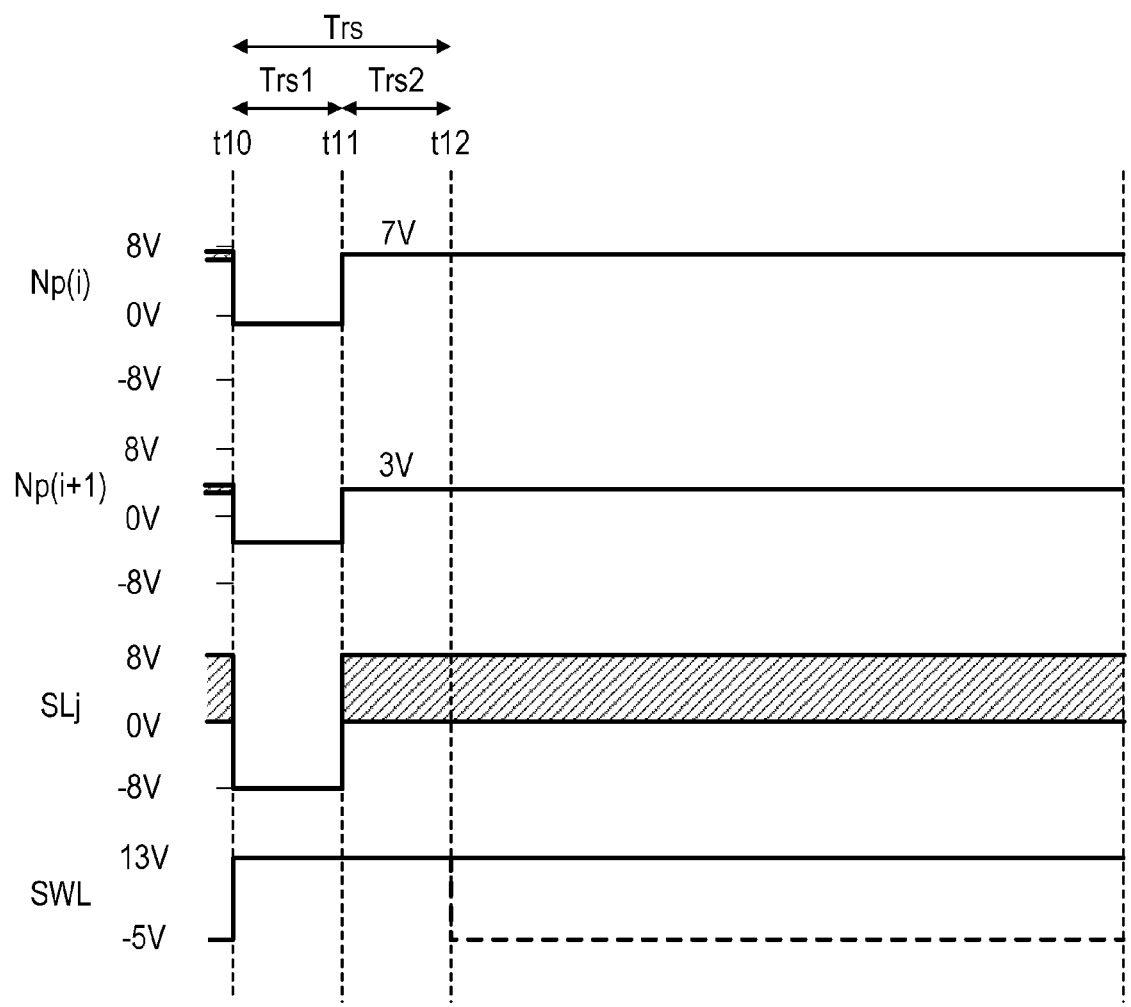
FIG. 13 is a timing chart showing an operation procedure of a restore operation for the pixel circuits having the type C and the type D.

FIG. 13 shows voltage waveforms of signal voltages or node voltages of the source line SLj, the first control signal line SWL, and the pixel node Np (i, j) and Np (i+1, j) of the two pixel circuits 3 (i, j) and 3 (i+1, j), in the case where the restore operation is performed for the two pixel circuits 3 (i, j) and 3 (i+1, j) in which the above memory operation has been performed. In addition, during the restore operation period Trs (times t10 to t12), the unselected row voltage (−5 V) is applied to all of the gate lines GL, and the thin film transistors T0 and the thin film transistors T3 in all of the pixel circuits 3 are in the off state. That is, the storage node Nm of each pixel circuit 3 is kept in the electrically separated floating state.

In addition, in the following description, it is assumed that after the above memory operation and before the start of the restore operation, the node voltage of each of the pixel nodes Np (i, j) and Np (i+1, j) has fluctuated due to the leak current of the thin film transistor T0 or the like.

During the restore operation period Trs for the times t10 to t12 shown in FIG. 13, the restore operation is executed for the two pixel circuits 3 (i, j) and 3 (i+1, j) at the same time. A period Trs1 for times t10 to t11 corresponds to a preprocessing period of the restore operation period Trs. A period Trs2 for times t11 to t12 corresponds to a real processing period of the restore operation period Trs.

At a starting point (time t10) of the preprocessing period Trs1 or prior to it, the restore control voltage (13 V) is applied to the first control signal lines SWL in all of the rows at the same time, and in addition, at the starting point of the preprocessing period Trs1, the second initialization control voltage (−8 V) is applied to the source line SLj. As a result, the thin film transistor T0 in the off state is turned on, and the voltages of the pixel nodes Np (i, j) and Np (i+1, j) decrease toward the second initialization control voltage (−8 V) at the same time. However, as for the pixel circuit 3C having the type C, since the thin film transistor T2 is in the on state, the current path is formed from the voltage supply line VSL to each of the pixel nodes Np (i, j) and Np (i+1, j) at the same time, while as for the pixel circuit 3D having the type D, since the diode D1 is in the forward-biased state and is turned on, the current path is formed from the first control signal line SWL to each of the pixel nodes Np (i, j) and Np (i+1, j) at the same time. Thus, the pixel circuits 3 having the type C and the type D are both eventually initialized to voltages (intermediate voltage) between the second initialization control voltage (−8 V) and the pixel data voltages Vpd just after the memory operation, which are provided by subtracting the threshold voltages Vt1 (i, j) and Vt1 (i+1, j) of the corresponding thin film transistors T1 from the hold voltages Vhd stored in the corresponding storage nodes Nm (i, j) and Nm (i+1, j), respectively. More specifically, the voltage of the pixel node Np (i, j) is initialized to the voltage (intermediate voltage) between the pixel data voltage Vpd (=7 V) just after the memory operation and the second initialization control voltage (−8 V), and the voltage of the pixel node Np (i+1, j) is initialized to the voltage (intermediate voltage) between the pixel data voltage Vpd (=3 V) just after the memory operation and the second initialization control voltage (−8 V). In addition, the intermediate voltage is automatically adjusted so that current values flowing in the thin film transistors T0, T1, and T2 exhibit the same value in the case of the pixel circuit 3C having the type C, while the intermediate voltage is automatically adjusted so that current values flowing in the thin film transistors T0 and T1 and the diode D1 exhibit the same value in the case of the pixel circuit 3D having the type D. Here, the second initialization control voltage (−8 V) is not limited to −8 V as long as the two conditions described in the restore operation for the pixel circuits 3 having the type A and the type B in the second embodiment are satisfied, and a third condition in which the thin film transistor T0 is turned on under the condition that the unselected row voltage (−5 V) is applied to the gate line GL is satisfied. In addition, as for the third condition, the state in which the unselected row voltage (−5 V) is applied to the gate line GL is specific to the pixel circuits 3 having the type C and the type D. Similarly, the unselected row voltage applied to the gate line GL is not limited to −5 V as long as the above two conditions, and the condition that the thin film transistor T0 is turned on under the condition that the second initialization control voltage is applied to the source line SL are satisfied.

Subsequently, during the real processing period Trs2, when the voltage of the source line SLj is returned to the normal source line voltage range, the thin film transistor T0 in the on state is returned to the off state, and each of the voltages of the pixel nodes Np (i, j) and Np (i+1, j) is charged from the initialized voltage level to the pixel data voltage Vpd just after the memory operation by which the thin film transistor T1 is turned off, with a charging current from the voltage supply line VSL or the first control signal line SWL toward each of the pixel nodes Np (i, j) and Np (i+1, j). In the memory operation, the hold voltage Vhd higher than the pixel data voltage Vpd of the pixel node Np by the threshold voltage Vth1 of the thin film transistor T1 is stored in the storage node Nm, so that in the restore operation, the voltage state of the pixel node Np can be restored to the pixel data voltage Vpd (7 V, 3 V) just after the memory operation, which is provided by subtracting the threshold voltage Vth1 from the hold voltage Vhd, without being affected by the variation of the threshold voltage Vth1 of the thin film transistor T1 among the pixel circuits 3.

After the real processing period Trs2, as shown in FIG. 13, the signal voltage of the first control signal line SWL may be maintained at the restore control voltage (13 V), or it may shift from the restore control voltage (13 V) to the writing control voltage (−5 V) to turn off the thin film transistor T2.

Here, it is to be noted that the pixel circuits 3 having the type A and the type B differ from the pixel circuits 3 having the type C and the type D only in that the gate electrode of the thin film transistor T3 is connected to the second control signal line CSL instead of the gate line GL, as described above. Therefore, in the pixel circuits 3 having the type A and the type B also, when the control for each of the second control signal lines CSLi, and CSLi+1 is performed similarly to that for each of the gate lines GLi, GLi+1, the same restore operation as the restore operation for the type C and the type D shown in FIG. 13 can be performed.

<<Another Example of Restore Operation, and Reset Operation>>

As for the pixel circuits 3 having the type C and the type D, as described above, the thin film transistor T0 and the thin film transistor T3 cannot be separately controlled, so that when the time to apply the restore control voltage (13 V) to the first control signal line SWL is delayed (refer to FIG. 10) to the starting point (time t11) of the real processing period Trs2 like the pixel circuits 3 having the type A and the type B, the current path is not formed from the voltage supply line VSL in the case of the pixel circuit 3C having the type C in preprocessing period Trs1, and from the first control signal line SWL in the case of the pixel circuit 3D having the type D, toward each of the pixel nodes Np (i, j), and Np (i+1, j). As a result, the voltage of the drain electrode of the thin film transistor T1 is discharged to the same voltage as that of the pixel node NP, and in the case where the thin film transistor T3 has the same electric characteristics (threshold voltage) as the thin film transistor T0, the thin film transistor T3 is likewise turned on because the thin film transistor T0 is in the on state. In this case, the one of the above two conditions that the thin film transistor T3 is kept in the off state could not be satisfied.

Therefore, as for the pixel circuits 3 having the type C and the type D, in the case where the thin film transistor T3 has the same electric characteristics (threshold voltage) as the thin film transistor T0, it is difficult to execute the other example (refer to FIG. 10) in which the time to apply the restore control voltage (13 V) to the first control signal line SWL is delayed to the starting point (time T11) of the real processing period Trs2 executed in the pixel circuits 3 having the type A and the type B, and to perform the same reset operation as performed for the pixel circuits 3 having the type A and the type B. However, the reset operation in which the reset voltage is not precisely set to the same voltage as the opposed voltage Vcom and set to its neighborhood value can be performed for the pixel circuits 3 having the type C and the type D.

Furthermore, when the threshold voltage of the thin film transistor T3 is set higher than that of the thin film transistor T0, the thin film transistor T3 can be individually turned off even when the thin film transistor T0 is in the on state. As a result, even in the pixel circuits 3 having the type C and the type D, it becomes possible to perform the same restore operation as the restore operation for the pixel circuits 3 having the type A and the type B in the other example (refer to FIG. 10), and the same reset operation as the reset operation for the pixel circuits 3 having the type A and the type B, by adjusting the voltage to be applied to the gate line GL and the source line SL to selectively turn on the thin film transistor T0 and to separately turn off the thin film transistor T3. More specifically, the voltage difference between the voltages to be applied to the gate line GL and the source line SL is to be set higher than the threshold voltage of the thin film transistor T0, and lower than the threshold voltage of the thin film transistor T3. However, as for the reset operation for the pixel circuits 3 having the type A and the type B, when the reset voltage is set to the same voltage as the opposed voltage Vcom, the voltage to be applied to the gate line GL becomes too high and the thin film transistor T3 could be turned on. Therefore, in the case where the voltage range of the pixel data voltage Vpd is 0 V to 8 V, the reset voltage is set to 0 V or lower and the opposed voltage Vcom is changed from 4 V to the reset voltage while the thin film transistor T3 is in the on state, so that the non-biased state can be provided between the pixel node Np and the opposed electrode 30.

Fourth Embodiment

In the fourth embodiment, the writing operation in the normal display mode for the pixel circuits 3A to 3D having the type A to the type D will be described with reference to the drawings.

In the writing operation in the normal display mode, the pixel data for one frame is divided with respect to each display line in a horizontal direction (row direction). Then, with respect to each one horizontal period, the pixel data voltage Vpd (multi-gradation analog voltage) corresponding to the pixel data for the one display line is applied to the source line SL in each column, and the selected row voltage (13 V) is applied to the gate line GL in the selected display line (selected row), so that the first switch circuit 22 in each pixel circuit 3 in the selected row is set to a conducting state, and the voltage in the source line SL in each column is transferred to the pixel node Np of each pixel circuit 3 in the selected row. The unelected row voltage (−5 V) is applied to the gate line GL in the unselected display line (unselected row) in order to set the first switch circuit 22 of each pixel circuit 3 in the unselected row to the non-conducting state. In addition, the timing control of the voltage application to each signal line in the writing operation to be described below is performed by the display control circuit 11 shown in FIGS. 1 and 2, and the respective voltages are applied by the display control circuit 11, the opposed electrode drive circuit 12, the source driver 13, and the gate driver 14.

Figure 14:
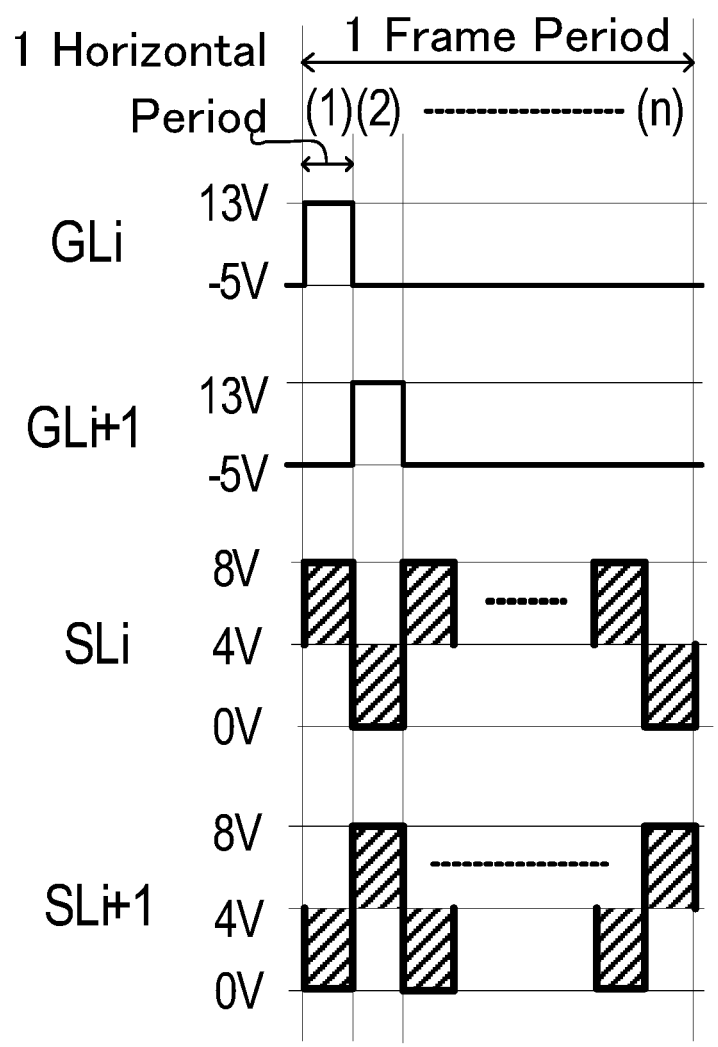
FIG. 14 is a timing chart showing an operation procedure of a writing operation in a normal display mode in the pixel circuit in the present invention.

FIG. 14 shows a timing chart of the writing operation in the normal display mode. The one frame period is divided into horizontal periods having the same number as the number of the gate lines GL, and sequentially allocated to the gate lines GL1 to GLn each selected for each horizontal period. FIG. 14 shows voltage waveforms of the two gate lines GLi, and GLi+1, and the two source lines SLj, and SLj+1 during the one frame period. It is assumed that the opposed voltage Vcom is 4 V similar to the second and third embodiments. In addition, whether the pixel circuit 3 has the type A or the type C, the voltage to be applied to the voltage supply line VSL is not necessarily the first initialization voltage (11 V).

Figure 19:
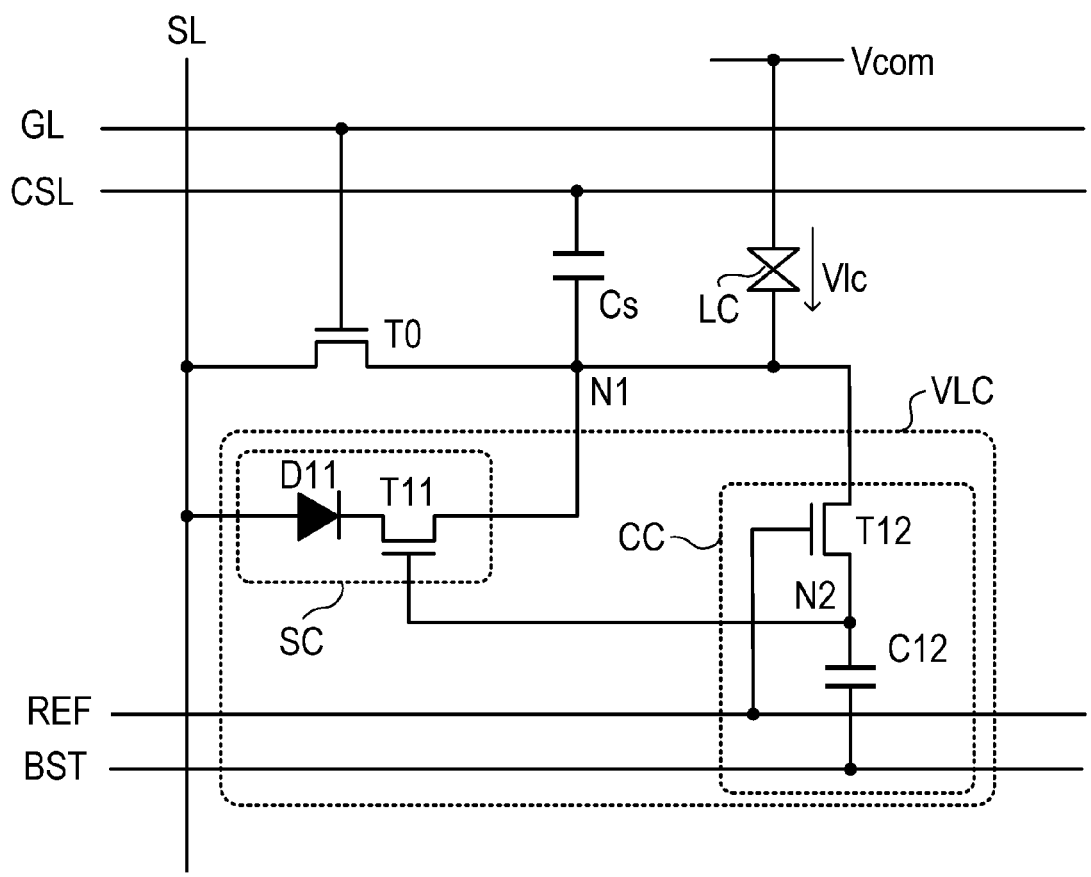
FIG. 19 is an equivalent circuit diagram showing one example of a conventional pixel circuit having a voltage reduction compensation circuit.

In the present embodiment, the opposed AC drive is not employed, so that the opposed voltage Vcom is fixed to 4 V, and the pixel data voltage Vpd within a range of 0 V to 4 V, or the pixel data voltage Vpd within a range of 4 V to 8 V which corresponds to the pixel data to be written in the pixel circuit 3 is applied to each of the source lines SL which are sequentially switched every one horizontal period (horizontal line reverse drive). Thus, the polarity of the liquid crystal voltage Vlc is reversed every one row in each column. In addition, the polarity of the liquid crystal voltage Vlc is reversed in the same pixel circuit 3 every one frame period (frame reverse drive). Furthermore, according to the example shown in FIG. 19, the source line SL is driven such that the polarity of the liquid crystal voltage Vlc is reversed between the adjacent columns in each row during the same frame period (vertical line reverse drive). When the horizontal line reverse drive and the vertical line reverse drive are executed at the same time, the polarity reverse drive (dot reverse drive) is performed by the pixel during the same frame period.

In the writing operation in the normal display mode, the memory circuit 23 of each pixel circuit 3 is not directly operated, so that the writing control voltage (−5 V) is applied to the first control signal line SWL, and the second switch circuit 24 is fixed to a non-conducting state. In addition, as for the pixel circuits 3 having the type A and the type B, the control unselected row voltage (−5 V) is applied to the second control signal line CSL in each row, and the third switch circuit 25 is fixed to the non-conducting state.

When the writing operation in the normal display mode shown in FIG. 14 is compared with the memory operation of the pixel circuits 3 having the type A to type D shown in FIGS. 8 and 12, the writing operation during the one horizontal period corresponds to a case where only the real processing periods T1b and T2b are continuously executed without executing the preprocessing periods T1a and T2a in the above memory operation periods T1 and T2.

An influence on the memory circuit 23 of the pixel circuit 3 when the writing operation is executed in the normal display mode depends on the type of the pixel circuit 3. As for the pixel circuit 3 having the type C or the type D, since the conducting/non-conducting of the third switch circuit 25 is controlled by the signal voltage of the gate line GL, the third switch circuit 25 is in the conducting state in the pixel circuit 3 in the selected row, and the drain electrode and the gate electrode of the thin film transistor T1 is short-circuited, so that the diode is formed from the storage node Nm to the pixel node Np in a forward direction. Therefore, in the writing operation, when the pixel data voltage Vpd which is lower than the voltage (pixel data voltage just after the memory operation) which is still lower than the hold voltage Vhd stored in the storage node Nm by the threshold voltage Vth1 of the thin film transistor T1 is newly written in the pixel node Np, the charges held in the storage node Nm is extracted toward the pixel node Np, so that the hold voltage Vhd stored in the storage node Nm is destroyed.

Meanwhile, as for the pixel circuits 3 having the type A and the type B, since the third switch circuit 25 is maintained in the non-conducting state in the writing operation in the normal display mode, the pixel node Np and the storage node Nm are electrically separated completely in the pixel circuit 3, and the hold voltage Vhd stored in the storage node Nm in the memory operation executed just before the writing operation can be continuously held, so that the pixel data voltage Vpd in the memory operation can be restored in the restore operation after the writing operation.

The description has been given to the case where the dot reverse drive is performed in the memory operation in the second and third embodiments and the writing operation in the fourth embodiment, but the horizontal line reverse drive or the vertical line reverse drive may be performed. Even when the liquid crystal voltage having the same absolute value is applied to the liquid crystal layer, there is a small difference in light transmittance between a positive polarity and a negative polarity, which could generate a little change in display manner between the frames. Therefore, the polarity of the liquid crystal voltage is reversed during the one frame period by the dot reverse drive or the like, in addition to the frame reverse drive, so that the little change can be prevented from being visually recognized, and display quality can be improved.

Other Embodiments

Hereinafter, other embodiments will be described.

<1> In each of the above embodiments, it is assumed that each of the four thin film transistors T0 to T3 constituting the pixel circuit 3 is formed of the n-channel oxide semiconductor thin film transistor, and especially, InGaZnO is assumed as the oxide semiconductor. However, the conductivity type of each of the thin film transistors T0 to T3 is not always limited to the n-channel type. The thin film transistors T0 to T3 may be partially or totally the p-channel type one.

For example, in the case where the thin film transistor T1 has the p-channel type, the forward-biased direction of the diode formed due to the short circuit of the drain electrode and the source electrode of the thin film transistor T1 is the reverse of the case described in the second to fifth embodiments, while the third switch circuit 25 is in the conducting state in the memory operation and the restore operation. Thus, during the preprocessing periods T1a and T2a just after the start of the memory operation periods T1 and T2, respectively, the first initialization voltage to be supplied to the storage node Nm needs to be lower than the voltage which is lower than the voltage range that the pixel data voltage Vpd held in the pixel node Np can take, by the threshold voltage Vth1 of the thin film transistor T1. In a case where the voltage range that the pixel data voltage Vpd can take is 0 V to 8 V, the first initialization voltage is set to −2 V or lower. Therefore, the voltages to be applied to the first control signal line SWL and the voltage supply line VSL accordingly need to be negative voltages.

<2> The voltages to be applied to the gate line GL, the source line SL, the first control signal line SWL, the second control signal line CSL, the voltage supply line VSL, and the opposed electrode wiring CML are not limited to the voltages illustrated in the memory operation, the restore operation, and the reset operation in the second and third embodiments, and the writing operation in the fourth embodiment. Those may be occasionally changed based on the electric characteristics (such as the threshold voltage and the conductivity type) of the thin film transistors T0 to T3 to be used, and the electric characteristics of the unit liquid crystal display element LC.

Furthermore, the description has been given to the case where the scan selected row voltage and the control selected row voltage are the same voltage, and the scan unselected row voltage and the control unselected row voltage are the same voltage in the second embodiment, but the scan selected row voltage and the control selected row voltage, and the scan unselected row voltage and the control unselected row voltage are not necessarily the same, respectively.

Furthermore, in the second to fourth embodiments, it is assumed that as the voltages to be applied to the gate line GL, the scan selected row voltage and the selected row voltage are the same voltage of 13 V, and the scan unselected row voltage and the unselected row voltage are the same voltage of −5 V, in the memory operation, the restore operation, the reset operation, the writing operation or the like, but they are not always required to be the same voltage among the respective operations.

<3> The method of driving each signal line in the writing operation in the normal display mode shown in FIG. 14 described in the fourth embodiment is one example of the case where the opposed AC drive is not used. Meanwhile, a driving method in the case where the opposed AC drive is used may be performed such that the opposed voltage Vcom is applied to the opposed electrode wiring CML while it is alternately switched between 0 V and 4 V every one horizontal period, and the pixel data voltage Vpd within a range of 0 V to 4 V which corresponds to the pixel data may be applied to each source line SL. In this case, a maximum value of the voltage range of the pixel data voltage Vpd is reduced from 8 V to 4 V, so that the selected row voltage to be applied to the gate line GL can be reduced from 13 V to about 8 V, only in the writing operation in the normal display mode.

<4> According to each of the above embodiments, it has been assumed that the pixel circuit array in its entirety provided on the active matrix substrate 10 includes the pixel circuit 3 having one of the type A to the type D having the memory circuit 23. Meanwhile, on the active matrix substrate 10, one part of the pixel circuit array may include the pixel circuit 3 having one of the type A to the type D, and the rest of the part may include the conventional pixel circuit not having the memory circuit 23.

Furthermore, according to each of the above embodiments, it is assumed that all of the pixel circuits 3 arranged in the same column (jth column) are connected to the common source line SLj, but another array configuration may be such that the number of the source lines SL is provided more than the column number m by one, and the pixel circuit 3 in the odd-numbered row arranged in the same column (jth column: j=1 to m) is connected to the common source line SLj, while the pixel circuit 3 in the even-numbered row is connected to the common source line SLj+1.

Furthermore, according to each of the above embodiments, it is assumed that all of the pixel circuits 3 arranged in the same row (ith row) are connected to the common gate line GLi, but another array configuration may be such that the number of the gate lines GL is provided more than the row number n by one, and the pixel circuit 3 in the odd-numbered column arranged in the same row (ith row: i=1 to n) is connected to the common gate line GLi, while the pixel circuit 3 in the even-numbered column is connected to a common gate line GLi+1. In this case, as for the pixel circuit 3 having the type A or type B, an array configuration is provided such that the number of the second control signal lines CSL is increased so as to be more than the row number n by one, and the pixel circuit 3 in the odd-numbered column arranged in the same row (ith row: i=1 to n) is connected to the common second control signal line CSLi, while the pixel circuit 3 in the even-numbered column is connected to the common second control signal line CSLi+1. In addition, in this array configuration, the pixel circuits 3 in the selected row are the series of pixel circuits 3 commonly connected to the one gate line GL selected among the (n+1) gate lines GL.

Figure 15:
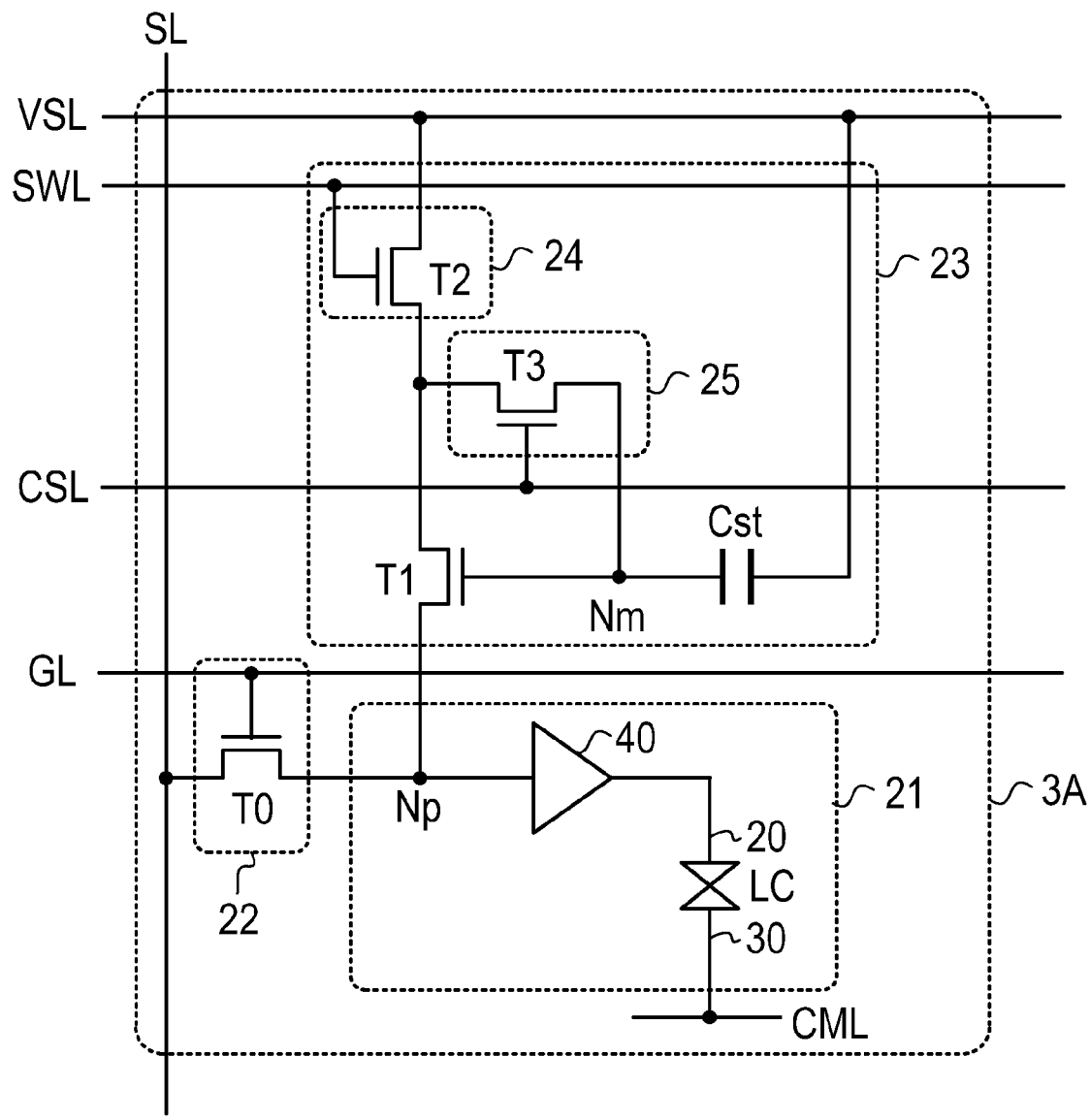
FIG. 15 is a circuit diagram showing another example of the pixel circuit including an analog amplifier in a display element unit in the present invention.

<5> According to each of the above embodiments, it is assumed that the display element unit 21 of the pixel circuit 3 includes only the unit liquid crystal display element LC, but as another configuration as shown in FIG. 15, an analog amplifier 40 (voltage amplifier) may be provided between the pixel node Np and the pixel electrode 20. FIG. 15 shows a case where the pixel circuit 3 includes the analog amplifier 40 in the display element unit 21, in the pixel circuit 3A having the type A, as one example.

In this case, the voltage applied to the pixel node Np is amplified at an amplification factor 11 set in the analog amplifier 40, and the amplified voltage is supplied to the pixel electrode 20. Thus, in this configuration, a minute voltage change of the pixel node Np can be reflected to the display image.

<6> According to each of the above embodiments, the description has been given to the case where each of the display devices 1 and 2 is the liquid crystal display device in which the display element unit 21 of the pixel circuit 3 includes the unit liquid crystal display element LC, but the display device is not limited to the liquid crystal display device, and the present invention is applicable as long as the display device is configured such that the display element unit 21 of the pixel circuit 3 has a display element whose display state is changed based on the pixel data voltage Vpd held in the pixel node Np.

Figure 16:
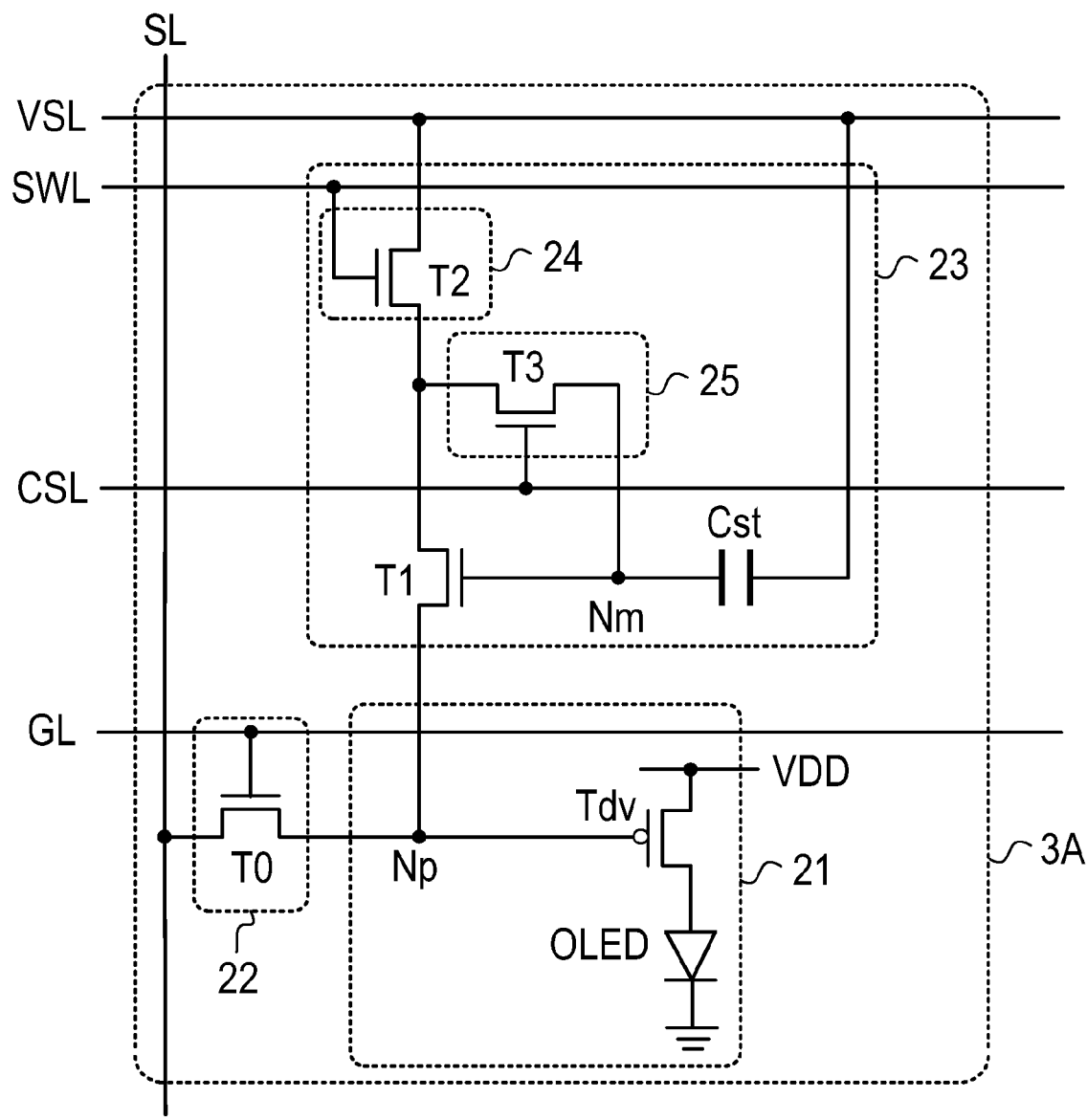
FIG. 16 is a circuit diagram showing another example of the pixel circuit including an organic light-emitting element in the display element unit in the present invention.

For example, even in the organic EL (Electroluminescence) display device, the pixel circuit 3 can be configured similarly to the pixel circuits 3 having the type A to the type D shown in FIGS. 4 to 7. FIG. 16 shows a case where the pixel circuit 3 for the organic EL is configured, in the pixel circuit 3A having the type A, as one example. Referring to FIG. 16, the pixel data voltage Vpd held in the pixel node Np is applied to a gate terminal of a driving transistor Tdv including a thin film transistor, and a current corresponding to the voltage flows to an organic light-emitting device OLED through the driving transistor Tdv, so that the display state is changed.

EXPLANATION OF REFERENCES 1, 2 Display device
3, 3A to 3D Pixel circuit
10 Active matrix substrate
11 Display control circuit
12 Opposed electrode drive circuit
13 Source driver
14 Gate driver
15 Second gate driver
20 Pixel electrode
21 Display element unit
22 First switch circuit
23 Memory circuit
24 Second switch circuit
25 Third switch circuit
30 Opposed electrode
31 Opposed substrate
32 Seal material
33 Liquid crystal layer
40 Analog amplifier
CML Opposed electrode wiring
CSL (CSL1, CSL2, CSLn) Second control signal line
Cst Capacitive element
Ct Timing signal
D1 Diode
DA Digital image signal
Dv Data signal
GL (GL1, GL2, GLn) Gate line
Gtc Scan side timing control signal
LC Unit liquid crystal display element
OLED Organic light-emitting device
Nm Storage node
Np Pixel node
SWL First control signal line
Sec Opposed voltage control signal
SL (SL1, SL2, . . . , SLm) Source line
Stc Data side timing control signal
T0, T1, T2, T3, Tdv Thin film transistor
Vcom Opposed voltage
Vlc Liquid crystal voltage
VSL Voltage supply line

The invention claimed is:

1. A pixel circuit comprising:
a pixel including a display cell in which a display state is changed based on a pixel data voltage held in a pixel node;
a first switch circuit to control a conducting state between a data signal line and the pixel node based on a signal level of a scanning signal line, and transferring the pixel data voltage supplied from the data signal line to the pixel node; and
a memory circuit to store a hold voltage having a constant relationship with the pixel data voltage in a storage node electrically separated from the pixel node, and restoring a voltage state of the pixel node to the pixel data voltage to be derived from the hold voltage, based on the hold voltage, wherein
the memory circuit includes:
a first transistor including a gate electrode connected to the storage node, and a source electrode connected to the pixel node;
a second switch circuit to control a conducting state between a drain electrode of the first transistor, and one of a voltage supply line and a first control signal line, based on a signal level of the first control signal line;
a third switch circuit to control a conducting state between the drain electrode and the gate electrode of the first transistor, based on a signal level of one of the scanning signal line and a second control signal line; and
a capacitor between the storage node, and one of the voltage supply line and a fixed voltage line,
the voltage supply line is supplied with a predetermined fixed voltage, and
the drain electrode of the first transistor is directly connected to one terminal of the second switch circuit and one terminal of the third switch circuit.

2. The pixel circuit according to claim 1, wherein the third switch circuit is switched to a non-conducting state to make the storage node a floating node, and the hold voltage stored in the storage node is continuously held.

3. The pixel circuit according to claim 1, wherein
the first switch circuit includes a second transistor including a drain electrode connected to the data signal line, a source electrode connected to the pixel node, and a gate electrode connected to the scanning signal line,
the second switch circuit includes one of a third transistor and a diode, the third transistor including a drain electrode connected to the voltage supply line, a source electrode connected to the drain electrode of the first transistor, and a gate electrode connected to the first control signal line, and the diode includes one end connected to the drain electrode of the first transistor, and the other end connected to the first control signal line, and
the third switch circuit includes a fourth transistor including a drain electrode connected to the drain electrode of the first transistor, a source electrode connected to the gate electrode of the first transistor, and a gate electrode connected to one of the scanning signal line and the second control signal line.

4. The pixel circuit according to claim 3, wherein the second transistor and the fourth transistor are thin film transistors having the same conductivity type, and the gate electrodes of the second and the fourth transistors are connected to the scanning signal line, respectively.

5. The pixel circuit according to claim 3, wherein each of the transistors are an n-channel thin film transistor.

6. The pixel circuit according to claim 3, wherein at least the fourth transistor is an oxide semiconductor thin film transistor.

7. The pixel circuit according to claim 1, wherein the pixel includes a liquid crystal display cell, and the pixel node is connected to a pixel electrode of the liquid crystal display.

8. The pixel circuit according to claim 1, wherein the hold voltage is higher than the pixel data voltage held in the pixel node by a threshold voltage of the first transistor.

9. A display device comprising:
a pixel circuit array in which a plurality of pixel circuits are arranged in each of a row direction and a column direction, each of the pixel circuits being identical to the pixel circuit according to claim 1, wherein
in each of the pixel circuits arranged in a same column, one end of the first switch circuit is connected to the data signal line arranged in the same column and extending in the column direction,
in each of the pixel circuits arranged in a same row, a first control terminal that controls a conducting state of the first switch circuit is connected to the scanning signal line arranged in the same row and extending in the row direction, and a third control terminal that controls a conducting state of the third switch circuit is connected to the second control signal line arranged in the same row and extending in the row direction, and
in each of the pixel circuits arranged in the same row or the same column, one of the other end of the second switch circuit and a second control terminal that controls a conducting state of the second switch circuit is connected to the common first control signal line;
a data signal line drive circuit for driving the data signal line individually;
a scanning signal line drive circuit for driving the scanning signal line individually;
a first control signal line drive circuit for driving the first control signal line; and
a second control signal line drive circuit for driving the second control signal line individually.

10. The display device according to claim 9, wherein
in a memory operation for simultaneously executing an operation of individually writing pixel data having two or more gradations and an operation of storing the hold voltage in the storage node by applying the pixel data voltage to the pixel node, in each of the pixel circuits arranged in one selected row, throughout an operation period of the memory operation, the second control signal line drive circuit applies a predetermined first control selected row voltage to the second control signal line in the selected row to set the third switch circuit of the pixel circuit arranged in the selected row to a conducting state, and applies a predetermined first control unselected row voltage to the second control signal line in unselected row to set the third switch circuit of the pixel circuit arranged in the unselected row to a non-conducting state,
during a preprocessing period just after a start of the operation period, the first control signal line drive circuit applies a predetermined first initialization control voltage to the first control signal line to set the second switch circuit to a conducting state and initialize the storage node of the pixel circuit arranged in the selected row to a predetermined first initialization voltage,
during at least a real processing period after the preprocessing period of the operation period in the operation period of the memory operation, the scanning signal line drive circuit applies a predetermined first scan selected row voltage to the scanning signal line in the selected row to set the first switch circuit of the pixel circuit arranged in the selected row to a conducting state, and applies a predetermined first scan unselected row voltage to the scanning signal line in the unselected row to set the first switch circuit of the pixel circuit arranged in the unselected row to a non-conducting state, and the data signal line drive circuit applies the pixel data voltage to the data signal line individually, and
during the real processing period of the operation period, the first control signal line drive circuit applies a predetermined writing control voltage to the first control signal line to set the second switch circuit to a non-conducting state, and stores the hold voltage in the storage node of the pixel circuit arranged in the selected row.

11. The display device according to claim 9, wherein
in a restore operation to restore a voltage state of the pixel node to the pixel data voltage corresponding to the hold voltage, based on the hold voltage stored in the storage node of the pixel circuit, the scanning signal line drive circuit applies a predetermined second scan selected row voltage to all of the scanning signal lines to set the first switch circuits of all of the pixel circuits to the conducting state, the second control signal line drive circuit applies a predetermined second control unselected row voltage to all of the second control signal lines to set the third switch circuits of all of the pixel circuits to the non-conducting state, and the data signal line drive circuit applies a predetermined second initialization control voltage to all of the data signal lines to initialize the voltage state of the pixel nodes of all of the pixel circuits through the first switch circuits, with the third switch circuit maintained in the non-conducting state, and then the scanning signal line drive circuit applies a predetermined second scan unselected row voltage to all of the scanning signal lines to set the first switch circuits of all of the pixel circuits to the non-conducting state, and
during a given period after the first switch circuit has been set to the non-conducting state, or throughout the restore operation, the first control signal line drive circuit applies a predetermined restore control voltage to the first control signal line to set the second switch circuit to the conducting state, and restores the initialized voltage state of the pixel node to the pixel data voltage corresponding to the hold voltage stored in the storage node.

12. The display device according to claim 9, wherein in a reset operation to reset the pixel data voltage held in the pixel nodes of all of the pixel circuits to a predetermined reset voltage, the scanning signal line drive circuit applies a predetermined third scan selected row voltage to all of the scanning signal lines to set the first switch circuits of all of the pixel circuits to the conducting state, the second control signal line drive circuit applies a predetermined third control unselected row voltage to all of the second control signal lines to set the third switch circuits in all of the pixel circuits to the non-conducting state, and the data signal line drive circuit applies the reset voltage to all of the data signal lines to set the voltage of the pixel nodes of all of the pixel circuits to the reset voltage, with the third switch circuit kept in the non-conducting state, and subsequently the scanning signal line drive circuit applies a predetermined third scan unselected row voltage to all of the scanning signal lines to set the first switch circuits in all of the pixel circuits to the non-conducting state.

13. The display device according to claim 12, wherein
when the pixel of the pixel circuit includes a liquid crystal display cell, the pixel node is connected to a pixel electrode of the liquid crystal display cell,
in the reset operation, the data signal line drive circuit applies a same voltage as a voltage applied to an opposed electrode of the liquid crystal display cell, to all of the data signal lines as the reset voltage, to provide a non-biased state in which the voltage is not applied between the pixel electrode and the opposed electrode of the liquid crystal display cell.

14. The display device according to claim 9, wherein the display device is an organic electroluminescent display device.

15. A display device comprising:
a pixel circuit array in which a plurality of pixel circuits are arranged in each of a row direction and a column direction, each of the pixel circuits being identical to the pixel circuit according to claim 1, wherein
in each of the pixel circuits arranged in a same column, one end of the first switch circuit is connected to the data signal line arranged in the same column and extending in the column direction,
in each of the pixel circuits arranged in a same row, a first control terminal that controls a conducting state of the first switch circuit, and a third control terminal that controls a conducting state of the third switch circuit is connected to the scanning signal line arranged in the same row and extending in the row direction, and
in each of the pixel circuit arranged in the same row or the same column, one of the other end of the second switch circuit and a second control terminal that controls a conducting state of the second switch circuit is connected to the common first control signal line;
a data signal line drive circuit for driving the data signal line individually;
a scanning signal line drive circuit for driving the scanning signal line individually; and
a first control signal line drive circuit for driving the first control signal line.

16. The display device according to claim 15, wherein
in a memory operation for simultaneously executing an operation of individually writing pixel data having two or more gradations and an operation of storing the hold voltage in the storage node by applying the pixel data voltage to the pixel node, in each of the pixel circuits arranged in one selected row, throughout an operation period of the memory operation, the scanning signal line drive circuit applies a predetermined first selected row voltage to the scanning signal line in the selected row to set the first switch circuit and the third switch circuit of the pixel circuit arranged in the selected row to a conducting state, and applies a predetermined first unselected row voltage to the scanning signal line in unselected row to set the first switch circuit and the third switch circuit of the pixel circuit arranged in the unselected row to a non-conducting state, and the data signal line drive circuit applies the pixel data voltage to the data signal line individually,
during a preprocessing period just after a start of the operation period, the first control signal line drive circuit applies a predetermined first initialization control voltage to the first control signal line to set the second switch circuit to a conducting state and initializes the storage node of the pixel circuit arranged in the selected row to a predetermined second initialization voltage, and
during a real processing period after the preprocessing period of the operation period, the first control signal line drive circuit applies a predetermined writing control voltage to the first control signal line to set the second switch circuit to a non-conducting state, and stores the hold voltage in the storage node of the pixel circuit arranged in the selected row.

17. The display device according to claim 15, wherein
in a restore operation to restore a voltage state of the pixel node to the pixel data voltage corresponding to the hold voltage, based on the hold voltage stored in the storage node of the pixel circuit, the scanning signal line drive circuit applies a predetermined second unselected row voltage to all of the scanning signal lines to set the first switch circuits and the third switch circuits of all of the pixel circuits to the non-conducting state, the control signal line drive circuit applies a predetermined restore control voltage to the first control signal line to set the second switch circuit to the conducting state, and
the data signal line drive circuit applies a predetermined third initialization control voltage to all of the data signal lines to set the first switch circuit from the non-conducting state to the conducting state under the condition that the second unselected row voltage is applied to the first control terminal of the first switch circuit, and initializes the voltage state of the pixel nodes of all of the pixel circuits through the first switch circuits with maintaining the third switch circuit in the non-conducting state, and subsequently returns the data signal line to the state before the third initialization control voltage is applied, to set the first switch circuit to the non-conducting state, and restores the initialized voltage state of the pixel node to the pixel data voltage corresponding to the hold voltage stored in the storage node.

18. The display device according to claim 15, wherein the display device is an organic electroluminescent display device.

* * * * *